US008354675B2

(12) United States Patent
Kwon et al.

(10) Patent No.: US 8,354,675 B2
(45) Date of Patent: Jan. 15, 2013

(54) ENHANCED CAPACITANCE DEEP TRENCH CAPACITOR FOR EDRAM

(75) Inventors: Oh-jung Kwon, Hopewell Junction, NY (US); Junedong Lee, Hopewell Junction, NY (US); Chengwen Pei, Danbury, CT (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 343 days.

(21) Appl. No.: 12/775,532

(22) Filed: May 7, 2010

(65) Prior Publication Data
US 2011/0272702 A1 Nov. 10, 2011

(51) Int. Cl.
*H01L 27/108* (2006.01)
(52) U.S. Cl. .......... 257/71; 257/301; 257/E21.647; 257/E27.084; 257/E27.092
(58) Field of Classification Search .......... 257/296–313, 257/533, 595–602, 923–924, E27.03–E27.035, 257/E27.037–E27.038, E27.041–E27.045, 257/E27.047–E27.048, E27.071, E27.092–E27.093, 257/E27.095, E27.101, E27.114–E27.116
See application file for complete search history.

(56) References Cited

U.S. PATENT DOCUMENTS

| | | | |
|---|---|---|---|
| 5,981,350 | A | 11/1999 | Geusic et al. |
| 6,083,787 | A | 7/2000 | Lee |
| 6,448,131 | B1 | 9/2002 | Cabral, Jr. et al. |
| 6,495,411 | B1 | 12/2002 | Mei |
| 6,555,430 | B1 | 4/2003 | Chudzik et al. |
| 6,657,276 | B1 | 12/2003 | Karlsson et al. |
| 6,734,077 | B2 | 5/2004 | Forster et al. |
| 6,909,137 | B2 | 6/2005 | Divakaruni et al. |
| 6,936,879 | B2 | 8/2005 | Furukawa et al. |
| 7,094,659 | B2 | 8/2006 | Chen et al. |
| 2003/0170952 | A1 | 9/2003 | Furukawa et al. |
| 2004/0079979 | A1 | 4/2004 | Lee et al. |
| 2008/0142862 | A1 | 6/2008 | Liao et al. |
| 2009/0079026 | A1 | 3/2009 | Zhu et al. |
| 2009/0101956 | A1 | 4/2009 | Booth, Jr. et al. |
| 2009/0176347 | A1 | 7/2009 | Cheng et al. |
| 2009/0184356 | A1 | 7/2009 | Brodsky et al. |

OTHER PUBLICATIONS

Birner, A. et al., "Capacitance Enhancement by Mesopore Formation for Sub 100nm Deep Trench DRAM Technology" Infineon Technologies, IEEE Xplore.
International Search Report dated Jul. 21, 2011, issued in corresponding International Application No. PCT/US2011/034430.

*Primary Examiner* — Mamadou Diallo
(74) *Attorney, Agent, or Firm* — Scully, Scott, Murphy & Presser, P.C.; Joseph P. Abate, Esq.

(57) ABSTRACT

A substrate including a stack of a handle substrate, an optional lower insulator layer, a doped polycrystalline semiconductor layer, an upper insulator layer, and a top semiconductor layer is provided. A deep trench is formed through the top semiconductor layer, the upper insulator layer, and the doped polycrystalline semiconductor layer. Exposed vertical surfaces of the polycrystalline semiconductor layer are crystallographically etched to form random facets in the deep trench, thereby increasing the total exposed surface area of the polycrystalline semiconductor layer in the deep trench. A node dielectric and at least one conductive material are deposited to fill the trench and to form a buried strap portion, which constitute a capacitor of an eDRAM. Access transistors and other logic devices can be formed.

25 Claims, 19 Drawing Sheets

ENHANCED CAPACITANCE DEEP TRENCH CAPACITOR FOR EDRAM

BACKGROUND

The present invention relates to an embedded dynamic random access memory (eDRAM) structure employing a polycrystalline semiconductor layer to provide enhanced capacitance and methods of manufacturing the same.

Embedded dynamic random access memory (eDRAM) is a dynamic random access memory (DRAM) embedded in a logic circuit to function as a high density cache memory. The eDRAM provides comparable access time as static random access memory (SRAM) at a smaller device area per cell. Typically, eDRAM arrays are employed as an L2 level cache or L3 level cache in a processor to provide a high density memory in a processor core. Due to high performance and a compact size, eDRAM has become one of the most efficient means for continued performance of semiconductor logic circuits requiring embedded memory including processors and system-on-chip (SoC) devices.

With the scaling of semiconductor devices, more eDRAM devices are formed per unit area in a semiconductor chip. Because each eDRAM requires a capacitor to store electrical charges, available device area per capacitor decreases in each generation. Typically, the capacitor for an eDRAM requires a minimum capacitance of 10 fF to 40 fF in order to provide sufficient retention time and addressability. In the case of an eDRAM employing a deep trench capacitor, the minimum capacitance requirement poses a significant challenge. Specifically, because the capacitance of a deep trench capacitor is proportional to the surface area of a node dielectric, and the allocated device area per deep trench continues to shrink in each technology generation, the capacitance of the deep trench capacitor employing the same geometry as in the previous generation provides lesser capacitance upon device scaling. Further, there is a limit to increasing the depth of a deep trench because the etching process for formation of the deep trench becomes exponentially ineffective with increasing depth. Nonetheless, device performance of an eDRAM suffers significantly if the capacitance of an eDRAM is less than the minimum capacitance required for optimal performance of the eDRAM.

BRIEF SUMMARY

A substrate including a stack of a handle substrate, an optional lower insulator layer, a doped polycrystalline semiconductor layer, an upper insulator layer, and a top semiconductor layer is provided. A deep trench is formed through the top semiconductor layer, the upper insulator layer, and the doped polycrystalline semiconductor layer. Exposed vertical surfaces of the polycrystalline semiconductor layer are crystallographically etched to form random facets in the deep trench, thereby increasing the total exposed surface area of the polycrystalline semiconductor layer in the deep trench. A node dielectric and at least one conductive material are deposited to fill the trench and to form a buried strap portion, which constitute a capacitor of an eDRAM. Access transistors and other logic devices can be formed. A moat isolation structure can be formed by employing an additional deep trench that contiguously surrounds the capacitor. Optionally, a backside contact structure can be formed through the upper insulator layer to provide a back bias to a portion of the polycrystalline semiconductor layer that constitutes the outer electrode of the capacitor. Other moat isolation structures and other backside contact structures can be formed in a logic area to provide back biasing of logic devices.

According to an aspect of the present invention, a semiconductor structure is provided, which includes: a semiconductor substrate including at least a handle substrate, a doped polycrystalline semiconductor layer located above the handle substrate, an upper insulator layer contacting a top surface of the doped polycrystalline semiconductor layer, and a top semiconductor layer contacting a top surface of the upper insulator layer; a deep trench extending from a top surface of the top semiconductor layer to a bottom surface of the doped polycrystalline semiconductor layer; a capacitor including an outer electrode including a portion of the doped polycrystalline semiconductor layer, a node dielectric located in the deep trench, and an inner electrode including at least one fill material within the node dielectric; and an access transistor located in the top semiconductor layer and controlling current flow to the inner electrode.

According to another aspect of the present invention, a method of forming a semiconductor structure is provided, which includes: forming a semiconductor substrate including at least a handle substrate, a doped polycrystalline semiconductor layer located above the handle substrate, an upper insulator layer contacting a top surface of the doped polycrystalline semiconductor layer, and a top semiconductor layer contacting a top surface of the upper insulator layer; forming a deep trench extending from a top surface of the top semiconductor layer to a bottom surface of the doped polycrystalline semiconductor layer; forming a node dielectric on sidewalls of the deep trench; forming an inner electrode by depositing at least one fill material on the node dielectric within the deep trench; and forming an access transistor having an electrically conductive path to the inner electrode in the top semiconductor layer.

DETAILED DESCRIPTION

Figure 1:
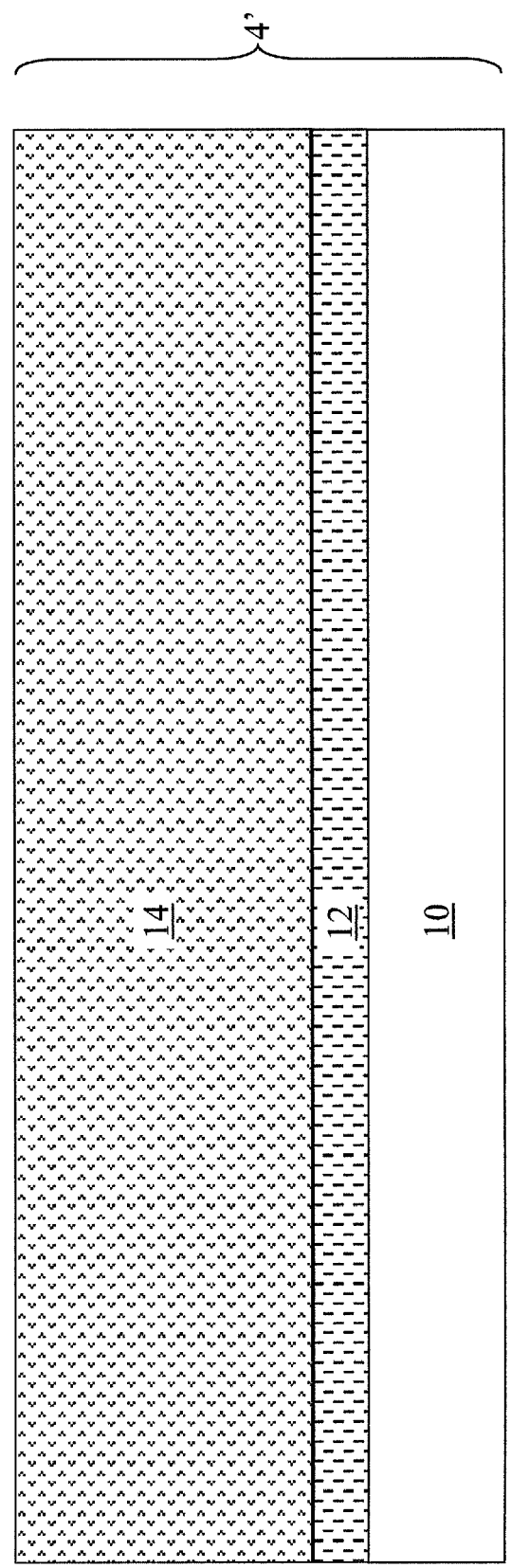
FIG. 1 is a vertical cross-sectional view of a first exemplary semiconductor structure after formation of a doped polycrystalline semiconductor layer on a handle substrate according to a first embodiment of the present invention.

As stated above, the present invention relates to an embedded dynamic random access memory (eDRAM) structure employing a polycrystalline semiconductor layer to provide enhanced capacitance and methods of manufacturing the same, which are now described in detail with accompanying figures. It is noted that like and corresponding elements mentioned herein and illustrated in the drawings are referred to by like reference numerals.

A "deep trench" herein refers to a trench that extends from a top surface of a top semiconductor layer to a depth below a bottom surface of an underlying insulator layer that contiguously extends under at least a plurality of devices. The underlying insulator layer may contiguously laterally extend across an entirety of a substrate.

Referring to FIG. 1, a first exemplary semiconductor structure according to a first embodiment of the present invention includes a first substrate 4, which includes, from bottom to top, a stack of a handle substrate 10, an optional lower insulator layer 12, and a doped polycrystalline semiconductor layer 14. The handle substrate 10 can be a semiconductor substrate, an insulator substrate, a conductive substrate, or a combination thereof. In case the handle substrate 10 includes a semiconductor substrate, the semiconductor substrate can be doped or undoped, and can include an amorphous material, a polycrystalline material, or a single crystalline material. For example, the handle substrate 10 can be a single crystalline silicon substrate. Alternately, the handle substrate 10 can be an insulator substrate such as a glass substrate, a sapphire substrate, or any other insulator material that can withstand the temperature cycles during subsequent processing steps. Yet alternately, the handle substrate 10 can be a conductive substrate such as a metal substrate. Still alternately, the handle substrate 10 can include a stack of different materials. The thickness of the handle substrate 10 is sufficient to provide mechanical support to other layers, i.e., the optional lower insulator layer 12 and/or the doped polycrystalline semiconductor layer 14. For example, the thickness of the handle substrate 10 can be from 50 microns to 1 mm, although lesser and greater thicknesses can also be employed.

The optional lower insulator layer 12 comprises a dielectric material such as silicon oxide and/or silicon nitride. In one embodiment, the optional lower insulator layer 12 can comprise thermal silicon oxide. The thickness of the optional lower insulator layer 12 can be from 20 nm to 5 microns, and typically from 100 nm to 1 micron. The optional lower insulator layer 12 is optional, i.e., may, or may not be present. The optional lower insulator layer 12 provides electrical isolation of devices above the optional lower insulator layer 12 from the handle substrate 10. If the handle substrate 10 is an insulator substrate, the optional lower insulator layer can be removed without affecting electrical isolation of devices in and above the doped polycrystalline semiconductor layer 14. The optional lower insulator layer 12 can be formed on the handle substrate 10 by deposition of a dielectric material, conversion of a surface portion of the handle substrate 10, or by bonding and/or cleaving.

The doped polycrystalline semiconductor layer 14 can be deposited as a doped polycrystalline semiconductor material, or can be deposited as an amorphous semiconductor material and subsequently annealed to convert to a doped polycrystalline semiconductor material. The doped polycrystalline semiconductor layer 14 can be deposed with in-situ doping. The doped polycrystalline semiconductor material of the doped polycrystalline semiconductor layer 14 can be selected from doped polysilicon, doped polycrystalline germanium, a doped silicon-germanium polycrystalline alloy, a doped silicon carbon polycrystalline alloy, a doped silicon-germanium-carbon polycrystalline alloy, doped polycrystalline gallium arsenide, doped polycrystalline indium arsenide, doped polycrystalline indium phosphide, doped polycrystalline III-V compound semiconductor materials, doped polycrystalline II-VI compound semiconductor materials, doped polycrystalline organic semiconductor materials, and other doped polycrystalline compound semiconductor materials. Because of the polycrystalline structure, the doped polycrystalline semiconductor layer 14 includes numerous microcrystalline grains, each of which includes faceted surfaces. Dimensions for a microcrystalline grain can be typically from 3 nm to 300 nm, and more typically from 6 nm to 100 nm, although the grain size can vary depending on the deposition conditions and anneal conditions. The orientations of the facets of the microcrystalline grains are typically mixed, although some preferential facet orientations can be present depending on deposition conditions. The thickness of the doped polycrystalline semiconductor layer 14 can be from 1 micron to 10 microns, and typically from 3 microns to 5 microns, although lesser and greater thicknesses can also be employed. The doped polycrystalline semiconductor layer 14 can be doped with n-type dopants or p-type dopants. The dopant concentration of the doped polycrystalline semiconductor layer 14 can be can be from $5.0\times10^{18}/cm^3$ to $3.0\times10^{21}/cm^3$, and typically from $2.0\times10^{19}/cm^3$ to $3.0\times10^{20}/cm^3$, although lesser and greater dopant concentrations can also be employed.

Figure 2:
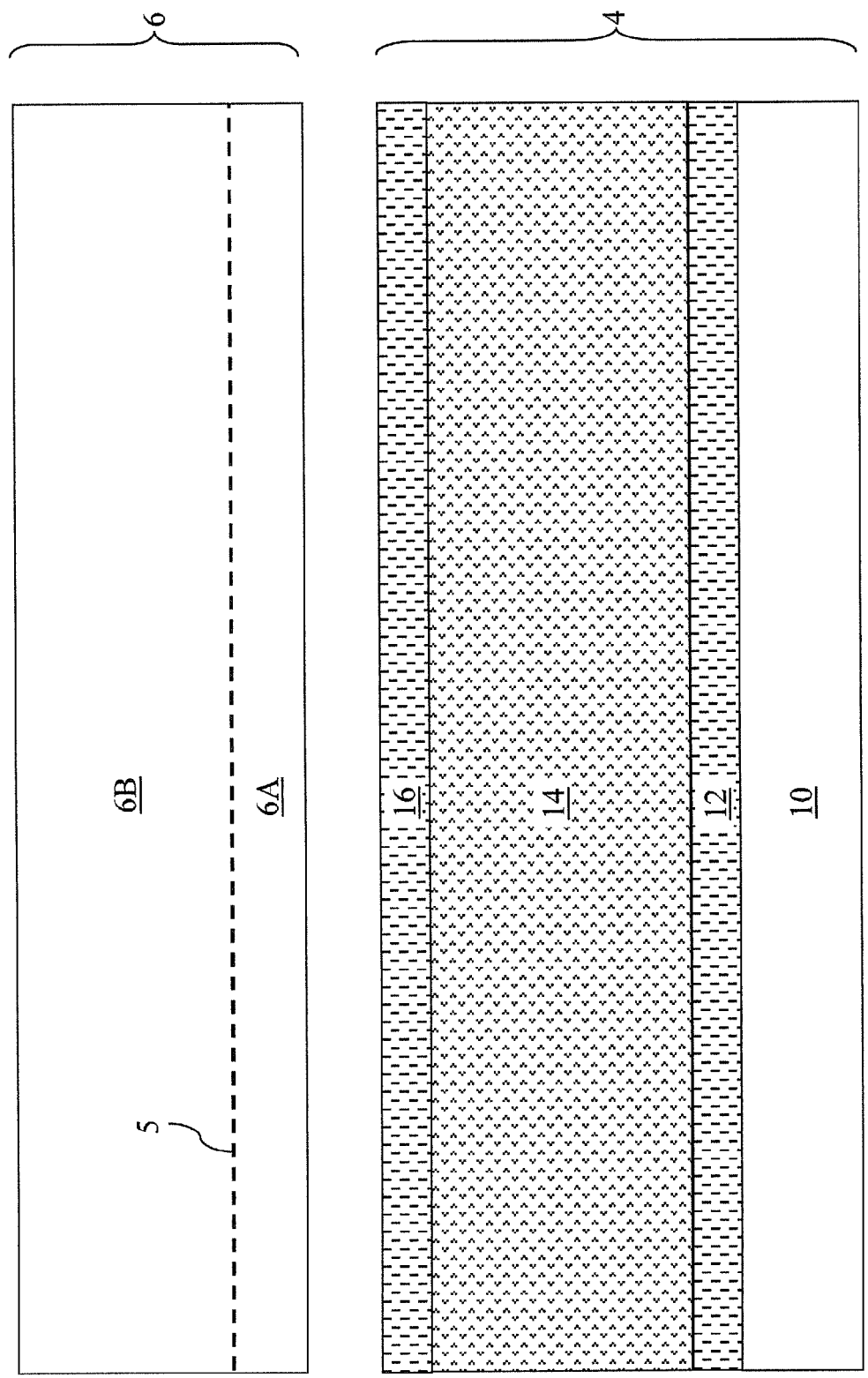
FIG. 2 is a vertical cross-sectional view of the first exemplary semiconductor structure after formation of the upper insulator layer and before bonding of a second substrate according to the first embodiment of the present invention.

Referring to FIG. 2, an upper insulator layer 16 is formed on the top surface of the doped polycrystalline semiconductor layer 14. The upper insulator layer 16 comprises a dielectric material such as silicon oxide and/or silicon nitride. In one embodiment, the upper insulator layer 16 can comprise thermal silicon oxide. The thickness of the upper insulator layer 16 can be from 20 nm to 1 microns, and typically from 50 nm to 300 nm, although lesser and greater thicknesses can also be employed. The upper insulator layer 16 provides electrical isolation of device components above the upper insulator layer 16 from the device components within the doped polycrystalline semiconductor layer 14. The upper insulator layer 16 can be formed on the doped polycrystalline semiconductor layer 14 by deposition of a dielectric material, conversion of a surface portion of the doped polycrystalline semiconductor layer 14 by thermal oxidation or nitridation and/or plasma oxidation or nitridation, or by bonding and/or cleaving of another substrate including dielectric material layer. After formation of the upper insulator layer 16, the first substrate 4 includes a stack, from bottom to top, of the handle substrate 10, the optional lower insulator layer 12, the doped polycrystalline semiconductor layer 14, and the upper insulator layer 16.

A second substrate 6 including a surface semiconductor layer 6A is provided. The second substrate 6 is typically a semiconductor substrate that includes a hydrogen implanted layer 5 embedded therein. The hydrogen implanted layer 5 is located between the surface semiconductor layer 6A and a bulk semiconductor layer 6B, and can be formed by implantation of hydrogen atoms through a surface (which is the bottom surface of the second substrate 6 in FIG. 2) to a constant depth employing methods known in the art. The depth of hydrogen implantation is typically the same as the thickness of the surface semiconductor layer 6A, and can be from 5 nm to 400 nm, and typically from 30 nm to 200 nm, although lesser and greater depths can also be employed.

Typically, the surface semiconductor layer 6A comprises a single crystalline semiconductor material. In one embodiment, the entirety of the second substrate 6 can comprise a single crystalline semiconductor material. The semiconductor material of the surface semiconductor layer 6A can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

The first substrate 4 and the second substrate 5 are bonded so that the top surface of the upper insulator layer 16 contacts the exposed surface of the surface semiconductor layer 6A. The second substrate 6 is subsequently cleaved at the hydrogen implanted layer 5 by an anneal, which can be performed at a temperature from 100° C. to 500° C.

Figure 3:
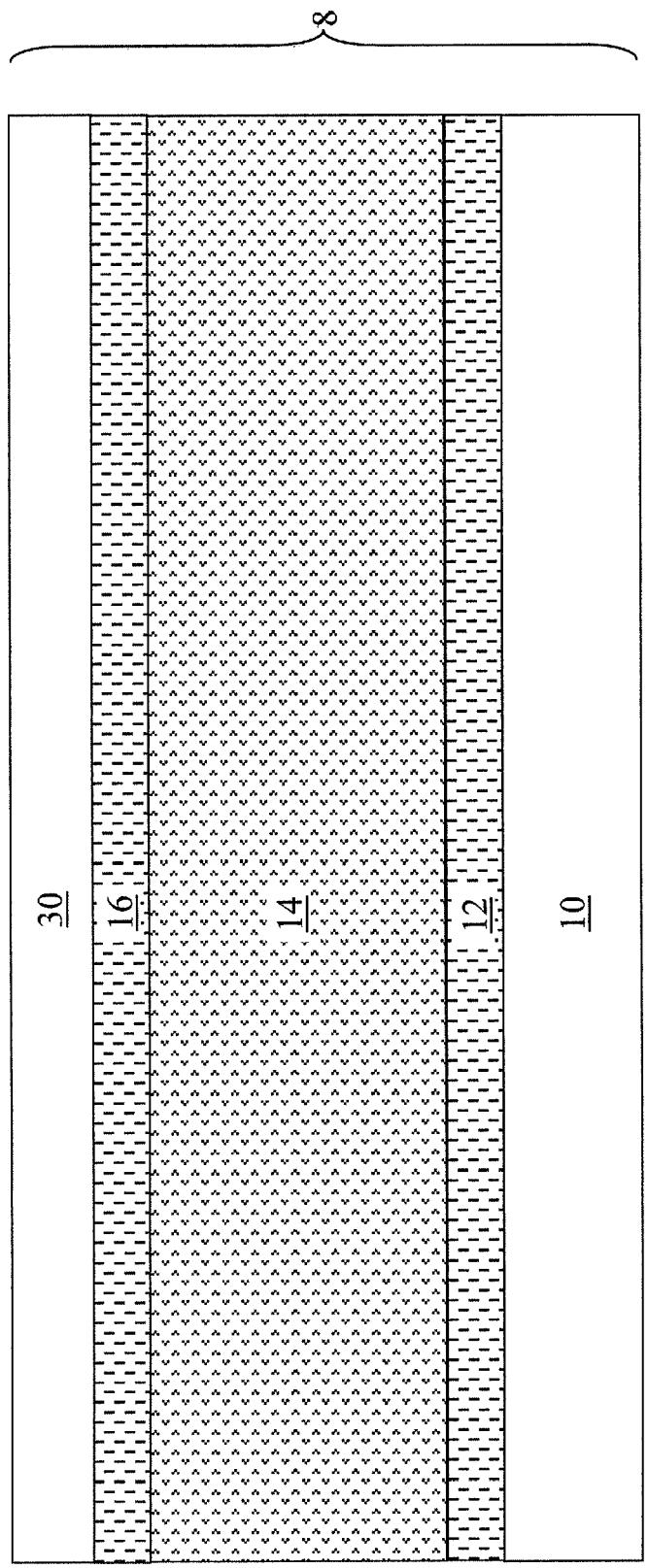
FIG. 3 is a vertical cross-sectional view of the first exemplary semiconductor structure after bonding of the second substrate and removal of a bulk portion of the second substrate by cleaving to form a semiconductor substrate according to the first embodiment of the present invention.

Referring to FIG. 3, the bulk semiconductor layer 6B is removed after cleaving the second substrate 6. The surface semiconductor layer 6A as bonded to the upper insulator layer 16 is herein referred to as a top semiconductor layer 30 to connote that this layer is located at the top of the upper insulator layer 16 and includes a semiconductor material. Typically, the top semiconductor layer 30 is a single crystalline semiconductor layer. The stack, from bottom to top, of the handle substrate 10, the optional lower insulator layer 12, the doped polycrystalline semiconductor layer 14, the upper insulator layer 16, and the top semiconductor layer 30 is herein referred to as a semiconductor substrate 8.

Figure 4A:
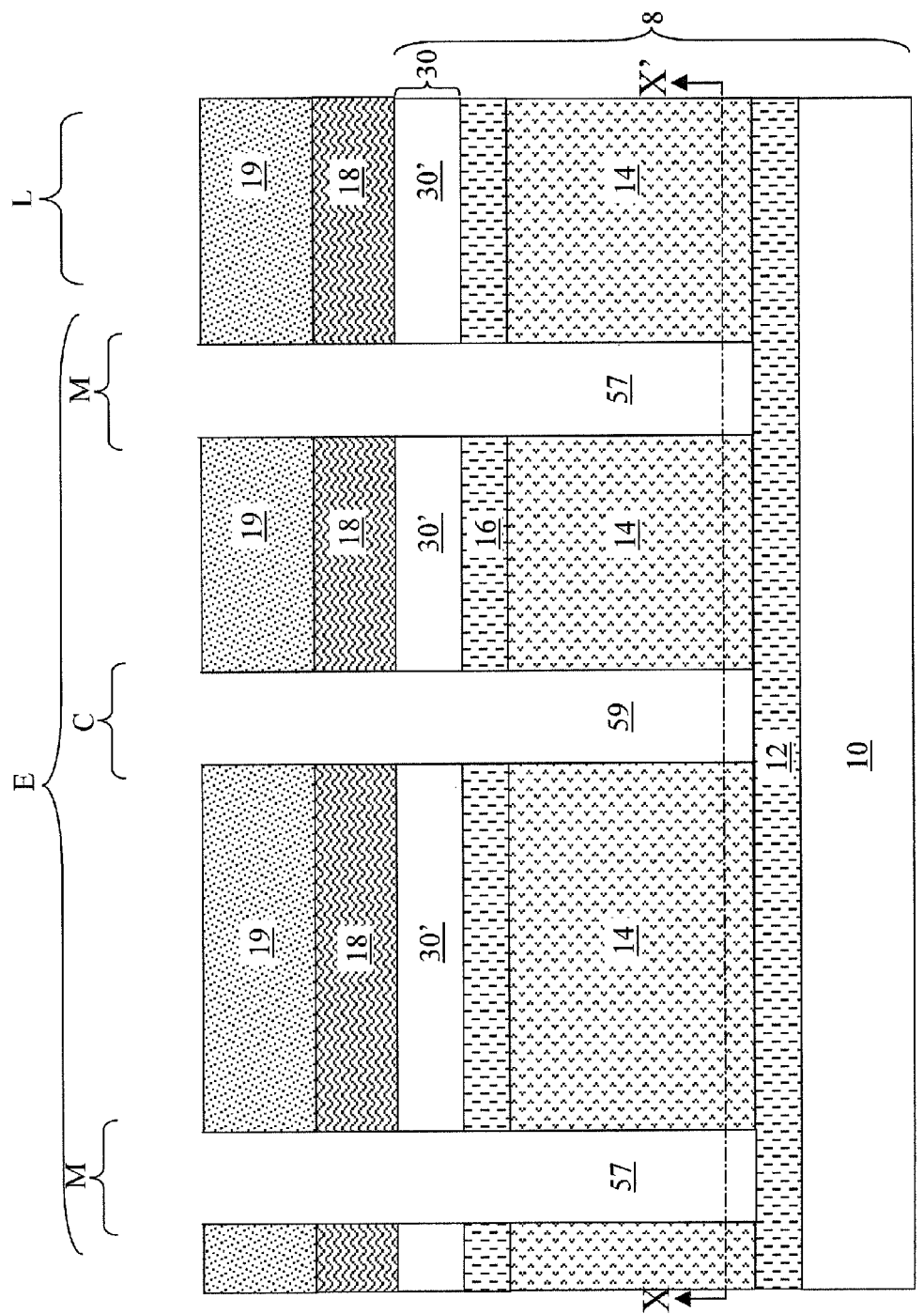
FIG. 4A is a vertical cross-sectional view of the first exemplary semiconductor structure after formation of deep trenches and a contiguous deep trench according to the first embodiment of the present invention.
Figure 4B:
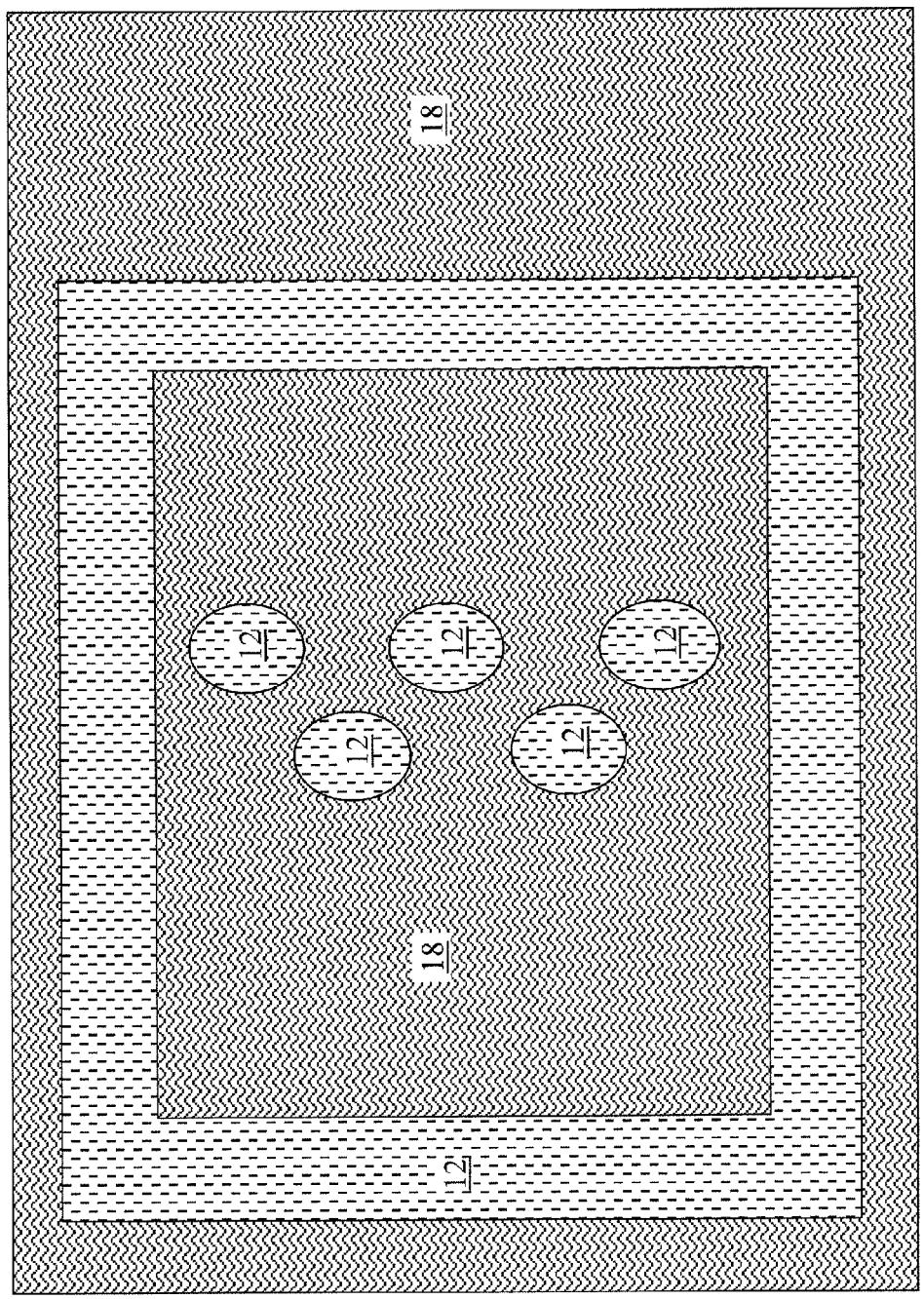
FIG. 4B is a horizontal cross-sectional view of the first exemplary semiconductor structure of FIG. 4A along a plane X-X' according to the first embodiment of the present invention.

Referring to FIGS. 4A and 4B, at least one pad layer 18 and a hardmask layer 19 are sequentially deposited on the top semiconductor layer 30. The at least one pad layer 18 can be formed directly on the top semiconductor layer 30, for example, by a blanket deposition employing chemical vapor deposition (CVD). Typically, the at least one pad layer 18 comprises a dielectric material such as a dielectric nitride or a dielectric oxide. The at least one pad layer 18 can comprise a stack of multiple dielectric layers or a combination of at least one dielectric layer and at least one semiconductor layer comprising silicon or a silicon containing alloy. For example and in one embodiment, the at least one pad layer can be a stack of a thin silicon oxide layer formed directly on the top semiconductor layer 30 and a thicker silicon nitride layer formed on the thin silicon oxide layer. The thickness of the at least one pad layer 18 can be from 80 nm to 1,000 nm, and preferably from 120 nm to 250 nm. The pad layer 40 can be formed directly on the top semiconductor layer 30 by chemical vapor deposition (CVD).

Optionally, a hardmask layer 19 can be deposited to be subsequently employed as an etch mask for forming deep trenches. The hardmask layer 19 typically comprises a dielectric material such as borosilicate glass (BSG) or undoped silicate glass (USG). The thickness of the hardmask layer 19 can be from 100 nm to 1 micron, although lesser and greater thicknesses can also be employed.

A photoresist (not shown) is formed on the top surface of the hardmask layer 19 and lithographically patterned to form openings in the photoresist. The openings in the photoresist can be formed over regions of the semiconductor substrate 8 in which eDRAM devices are subsequently formed. This region is herein referred to as an eDRAM region E. Logic devices can be subsequently formed in another region of the semiconductor substrate 8. This region is herein referred to as a logic region L.

The pattern in the photoresist can be transferred into the hardmask layer 19 by a first anisotropic etch, which is referred to as a mask open etch. After the pattern in the photoresist is duplicated in the hardmask layer 19, the photoresist can be removed, for example, by ashing. Employing the hardmask layer 19 as an etch mask, the pattern in the hardmask layer is transferred through the at least one pad layer 18, the top semiconductor layer 30, the upper insulator layer 16, and the doped polycrystalline semiconductor layer 14 by another anisotropic etch, which is referred to as a deep trench etch.

In one embodiment, the deep trench etch stops on the top surface of the optional lower insulator layer 12, or on the top surface of the handle substrate 10 if the optional lower insulator layer 12 is not present. If the optional lower insulator layer 12 is present, a top surface of the optional lower insulator layer 12 can be exposed at the end of the deep trench etch. If the optional insulator layer 12 is not present, a top surface of the handle substrate 10 can be exposed at the end of the deep trench etch. In another embodiment, the deep trench etch stops in the middle of the doped polycrystalline semiconductor layer 14, i.e., between the bottom surface of the doped polycrystalline semiconductor layer 14 and the top surface of the doped polycrystalline semiconductor layer 14.

The deep trench etch can form a plurality of deep trenches 59 and a contiguous deep trench 57. Each deep trench 59 is an isolated trench having a horizontal cross-sectional area of a circle, an ellipse, or a polygon such as a rectangle. Sidewalls of each deep trench 59 extend from the top surface of the at least one pad layer 18 to the bottom surface of the doped polycrystalline semiconductor layer 14. Each region of including a deep trench 59 and an immediate vicinity thereof, i.e., each region within and in proximity to sidewalls of a deep trench 59, is herein referred to as a capacitor region C, in which a capacitor is subsequently formed. Each capacitor region C is located within the eDRAM region E. Each deep trench 59 extends from a top surface of the top semiconductor layer 30 to a bottom surface of the doped polycrystalline semiconductor layer 14. The area of the contiguous deep trench 57 is herein referred to as a moat region M.

Further, a first contiguous deep trench 57 can be formed around the plurality of deep trenches 59 within the eDRAM region E. The first contiguous deep trench 57 contiguously extends around the plurality of deep trenches 59 and laterally encloses the plurality of deep trenches 59. The contiguous deep trench 57 can have the same depth as the plurality of deep trenches 59. In one embodiment, the contiguous deep trench 57 extends from the top surface of the top semiconductor layer 30 to the bottom surface of the doped polycrystalline semiconductor layer 14. The remaining portions of the top semiconductor layer 30 include top semiconductor portions 30' which are laterally separated by the contiguous deep trench 57. A top semiconductor portion 30' within the eDRAM region E includes at least one hole, each corresponding to one of the at least one deep trench 59. The hardmask layer 19 is subsequently removed selective to the at least one pad layer 18.

Figure 5A:
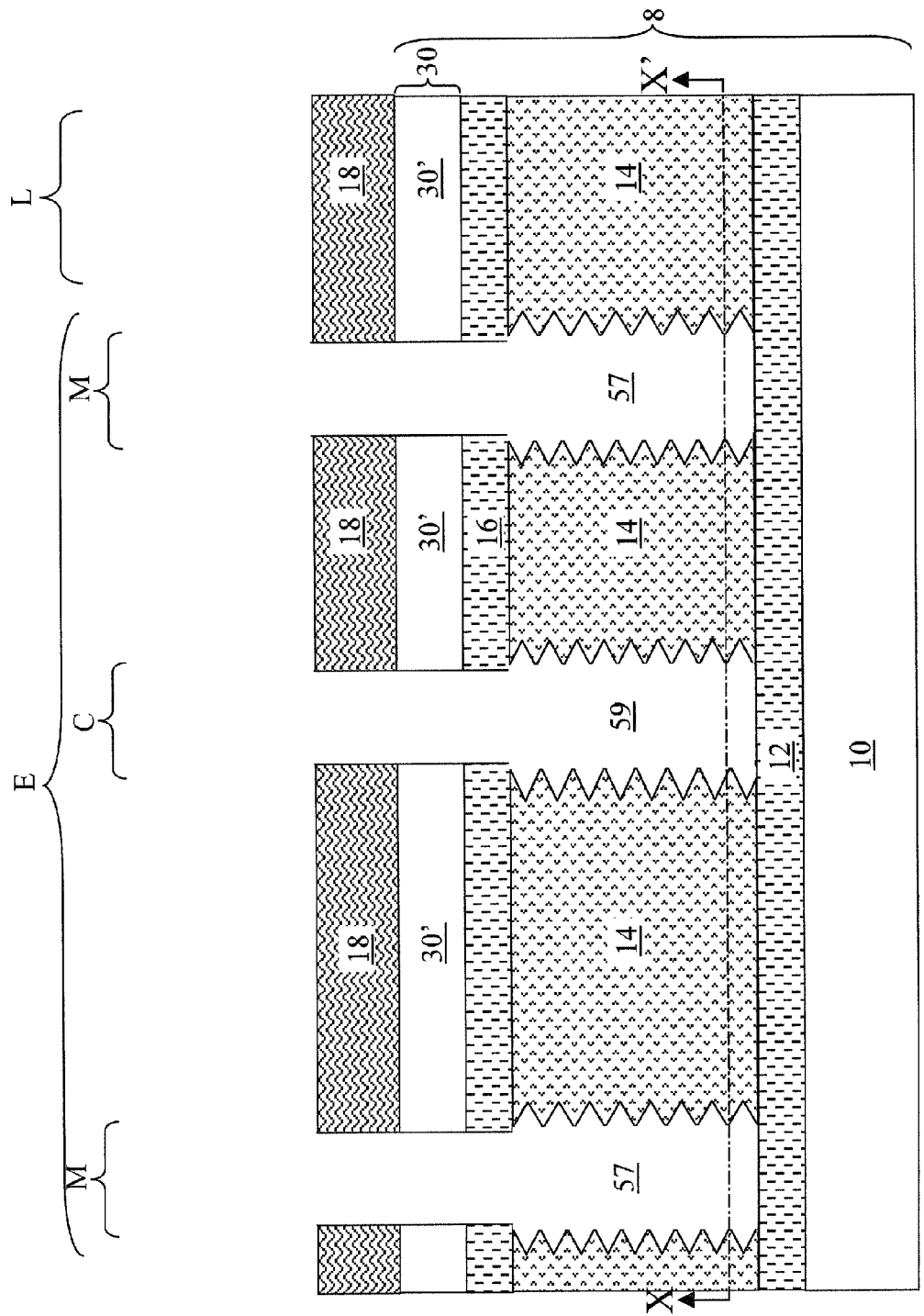
FIG. 5A is a vertical cross-sectional view of the first exemplary semiconductor structure after a crystallographic etch according to the first embodiment of the present invention.
Figure 5B:
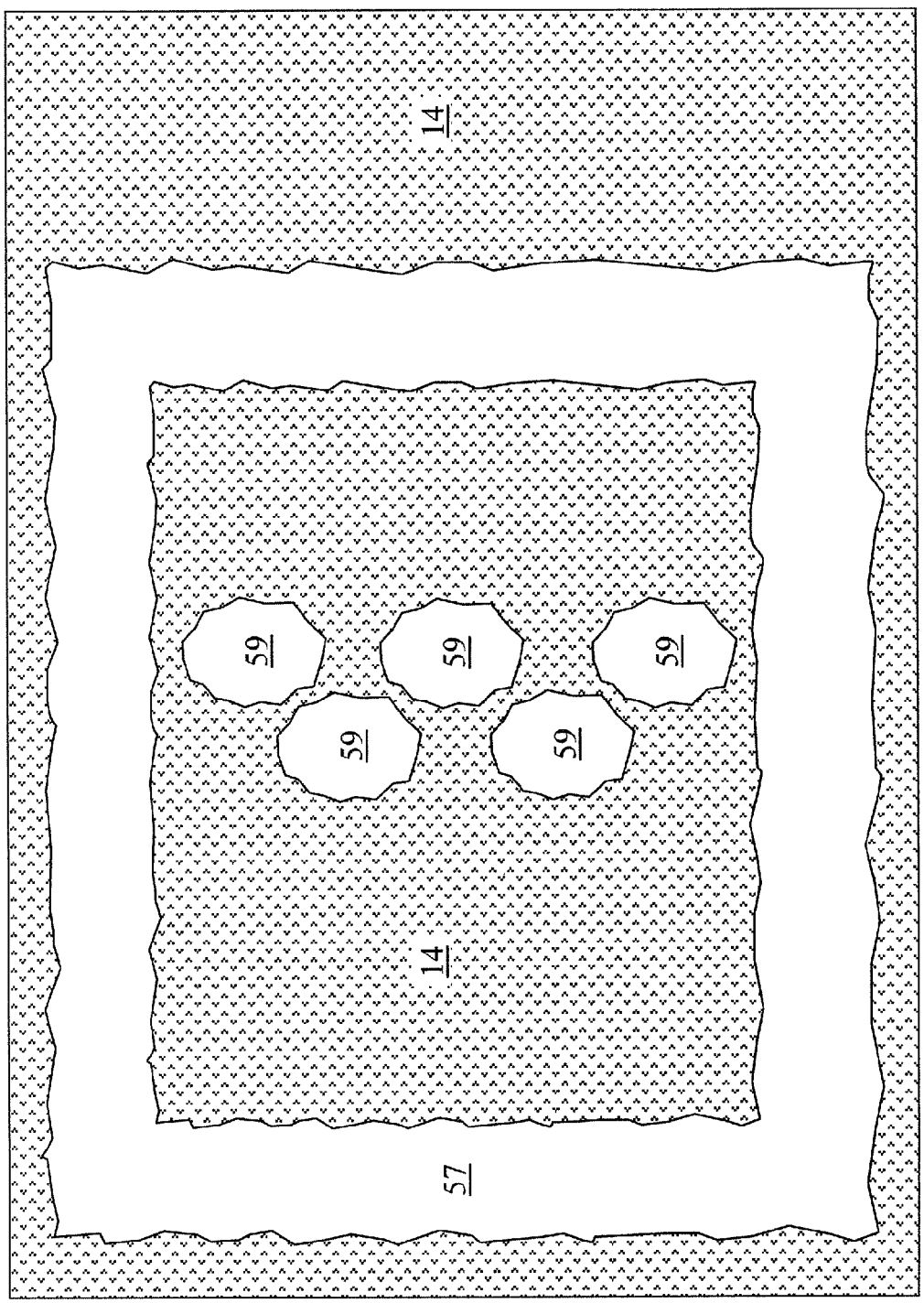
FIG. 5B is a horizontal cross-sectional view of the first exemplary semiconductor structure of FIG. 5A along a plane X-X' according to the first embodiment of the present invention.

Referring to FIGS. 5A and 5B, the doped polycrystalline semiconductor material in the doped polycrystalline semiconductor layer 14 is etched, for example, by a dry etch or a wet etch. In one embodiment, the etching of the doped polycrystalline semiconductor layer 14 is effected by a crystallographic etch that etches surfaces of different crystallographic facets at different etch rates.

For example, the ratio of the etch rate ratio of {100} planes to that of {110} planes of silicon facets can be changed by more than an order of magnitude through the modulation of the amount of surfactant added to the wet etch chemicals. Use of a pure TMAH (tetramethyl-ammonium hydroxide; $(CH_3)_4NOH$) solution with modulated quantities of surfactants can form facets predominantly in {110} orientations or facets predominantly in {100} orientations. Various other chemicals can be employed to provide a crystallographic etch in which facets are formed predominantly in one type of crystallographic planes having the same equivalent Miller indices. For example, dilute hydrofluoric acid (DHF), ammonium hydroxide ($NH_4OH$), and a hydrogen peroxide solution, can be employed in various concentrations and order to provide a crystallographic etching process that generates crystallographic facets on grains such that the crystallographic facets have the same equivalent Miller indices.

Miller indices are a notation system in crystallography for planes and directions in crystal (Bravais) lattices. (h k l) denotes a family of lattice planes that are orthogonal to a direction vector (h, k, l) in the basis of the reciprocal lattice vectors. The notation {h k l} denotes the set of all planes that are equivalent to (h k l) by the symmetry of the lattice. [h k l] denotes a direction of a vector (h, k, l) in the basis of the direct lattice vectors. <h k l> denotes the set of all directions that are equivalent to [h k l] by symmetry.

Crystallographic facets of grains of the doped polycrystalline semiconductor material of the doped polycrystalline semiconductor layer 14 are formed on the sidewalls of the plurality of deep trenches 59 and the sidewalls of the contiguous deep trench 57 by crystallographic etching that provides different etch rates for different crystallographic facets. A predominant portion of the crystallographic facets of grains of the doped polycrystalline semiconductor material has a set of Miller indices representing the same equivalent crystallographic orientation because of the preferential formation of a certain types of facets during the crystallographic etch. In other words, a predominant portion of the crystallographic facets of grains of the doped polycrystalline semiconductor material can have a set of Miller indices representing an equivalent crystallographic orientation. Surfaces of the plurality of deep trenches 59 within the doped polycrystalline semiconductor layer 14 include crystallographic facets of grains of the doped polycrystalline semiconductor material, and some of the crystallographic facets are not vertical. Typically, most of the crystallographic facets are not vertical due to the randomness of the orientations of original facets of the grains of the doped polycrystalline semiconductor layer 14 as originally formed.

In one embodiment, an entirety of surfaces of the deep trench between the top surface of the doped polycrystalline semiconductor layer 14 and a bottom surface of the doped polycrystalline semiconductor layer 14 consists essentially of the crystallographic facets of grains of the doped polycrystalline semiconductor material. Due to the random orientations of the facets as provided in the doped polycrystalline semiconductor layer 14 at the time of formation, most horizontal cross-sectional areas of the deep trench are irregular polygons. The shape of the horizontal cross-section of each deep trench 59 changes with the height of the plane of the horizontal cross-section. It is understood that each deep trench 59 can have different horizontal cross-sectional area due to the randomness of the grain orientation distribution in the doped polycrystalline semiconductor layer 14. Further, it is understood that the vertical cross-sectional profiles of a deep trench 59 does not imply any periodicity in the vertical direction in the profile of the deep trench 59. Each side of an irregular polygon corresponds to a facet of the crystallographic facets of grains of the doped polycrystalline semiconductor material.

The total surface area of each deep trench 59 between the top surface and the bottom surface of the doped polycrystalline semiconductor layer 14 can be from 1.2 to 3.0, and typically from 1.4 to 2.0, times the surface area of sidewalls of that deep trench 59 before the crystallographic etch. The total surface area of the contiguous deep trench 57 between the top surface and the bottom surface of the doped polycrystalline semiconductor layer 14 increases correspondingly during the crystallographic etch. Embodiments in which the crystallographic etch is omitted can also be employed. Embodiments in which non-crystallographic etch is substituted for crystallographic etch can also be employed.

Figure 6:
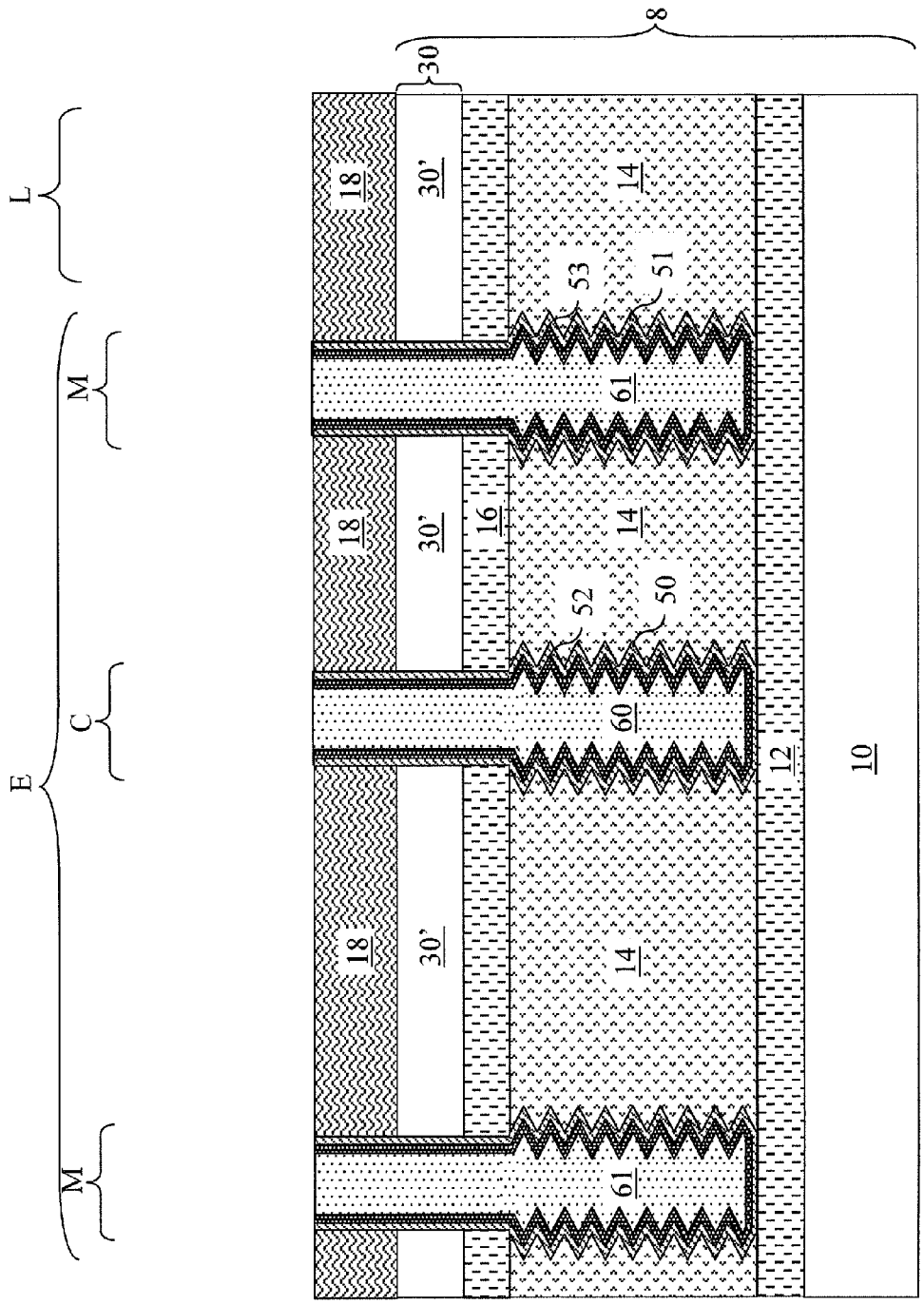
FIG. 6 is a vertical cross-sectional view of the first exemplary semiconductor structure after formation of node dielectrics and inner electrodes according to the first embodiment of the present invention.

Referring to FIG. 6, a node dielectric 50 and an inner electrode is formed within each deep trench 59. Specifically, a node dielectric layer is formed directly on sidewalls and a bottom surface of each deep trench 59, the sidewall and the bottom surface of the contiguous deep trench 57, and the top surface of the at least one pad layer 18. 10. At least one fill material is deposited within the plurality of deep trenches 59 and the contiguous deep trench 57 to fill the plurality of deep trenches 59 and the contiguous deep trench 57. Excess portions of the node dielectric layer and the at least one fill material above the top surface of the at least one pad layer 18 are removed by planarization, which can be effected, for example, by a recess etch, chemical mechanical planarization (CMP), or a combination thereof.

The remaining portion of the node dielectric layer within each deep trench 59 constitutes a node dielectric 50. The remaining portion of the at least one fill material within each deep trench 59 constitutes an inner electrode. The remaining portion of the node dielectric layer within the contiguous deep trench 57 constitutes a first isolation dielectric layer 51. The remaining portion of the at least one fill material within the contiguous deep trench 57 constitutes at least one conductive material portion.

The first isolation dielectric layer 51 and each of the node dielectrics 50 are composed of a dielectric material. Each node dielectric 50 can comprise silicon oxide, silicon nitride, silicon oxynitride, a high-k dielectric material, or any combination of these materials. In one embodiment, the node dielectrics 50 and the first isolation dielectric layer 51 comprise a dielectric metal oxide having a dielectric constant greater than 8.0. The dielectric materials for the node dielectrics 50 and the first isolation dielectric layer 51 include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, and any combination of these materials. The node dielectric layer can be formed, for example, by a thermal oxidation, chemical oxidation, thermal nitridation, atomic layer deposition (ALD), chemical vapor deposition (CVD), low-pressure chemical vapor deposition (LPCVD), and/or any other suitable methods. In another embodiment, the node dielectrics 50 and the first isolation dielectric layer 51 can be formed only on semiconductor surfaces, i.e., surfaces of the doped polycrystalline semiconductor layer 14 and the sidewalls of the top semiconductor portions 30' formed by conversion of semiconductor materials into dielectric materials such as thermal nitridation and/or thermal oxidation.

The at least one fill material includes a conductive material such as a metallic material or a doped semiconductor material. For example, the at least one fill material can include a metallic material and/or a doped semiconductor material. Each of the at least one fill material can be deposited, for example, by low pressure chemical vapor deposition (LPCVD) or atomic layer deposition (ALD). The metallic material can include at least one of Ta, Ti, W, CoWP, TaN, TiN, and WN. The doped semiconductor material can include doped polysilicon, germanium, a silicon germanium alloy, and/or any doped compound semiconductor material.

For example, each inner electrode can include an inner electrode metallic layer 52 located directly on a node dielectric 50 and an inner electrode doped semiconductor portion 60 located on inner sidewalls of the inner electrode metallic layer 52. The at least one conductive material portion has the same material(s) as the inner electrodes (52, 60). For example, the at least one conductive material portion within the first isolation dielectric layer 51 can include a first moat metallic layer 53 and a first moat doped semiconductor portion 61. Each of the first moat metallic layer 53 and the first moat doped semiconductor portion 61 is of unitary construction, i.e., is a single contiguous piece. The top surfaces of the node dielectrics 50, the inner electrodes (52, 60), the first isolation dielectric layer 51, and the at least one conductive material portion (53, 61) are substantially coplanar with the top surface of the at least one pad layer 18.

Figure 7A:
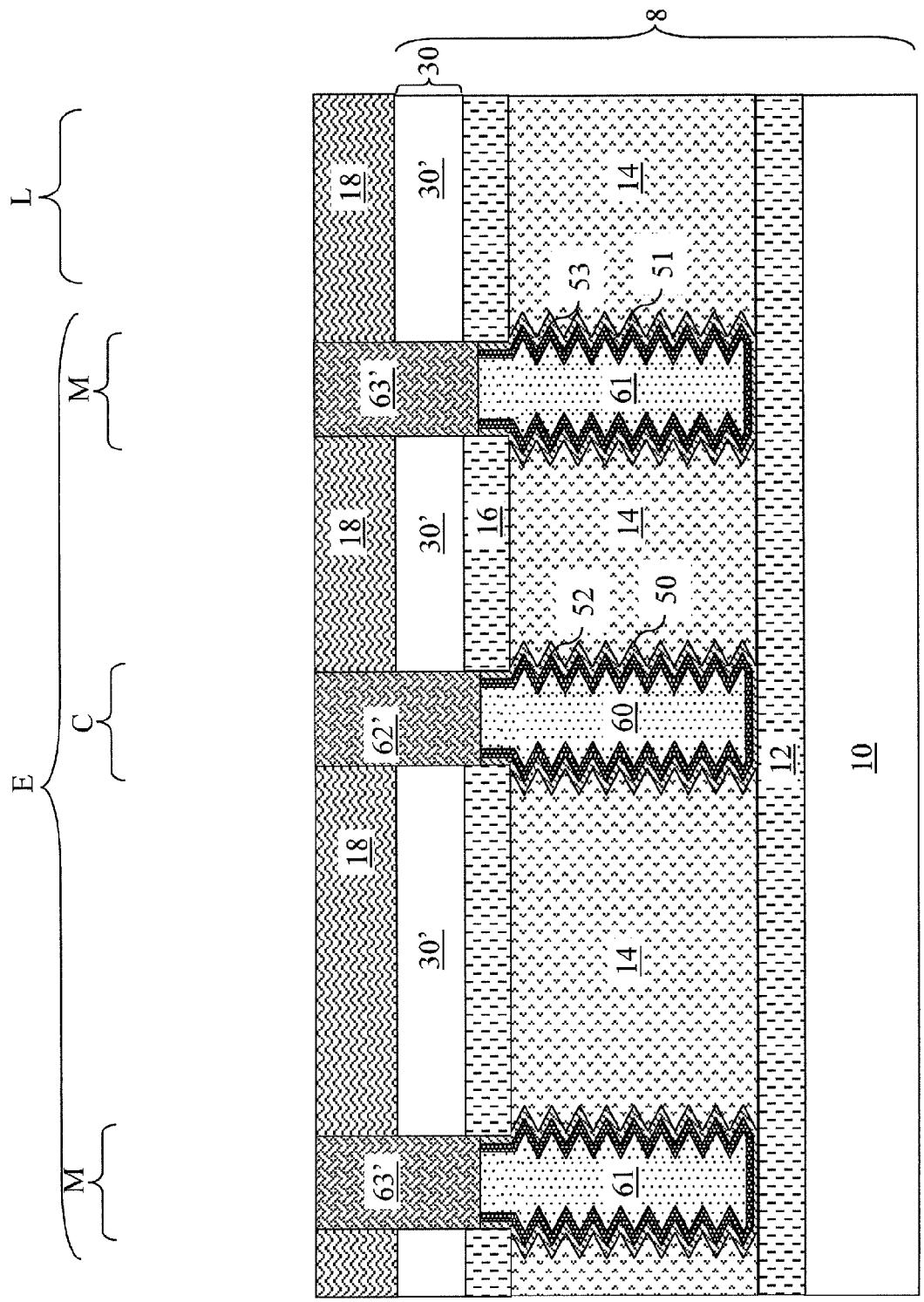
FIG. 7A is a vertical cross-sectional view of the first exemplary semiconductor structure after formation of prototype buried strap portions according to the first embodiment of the present invention.
Figure 7B:
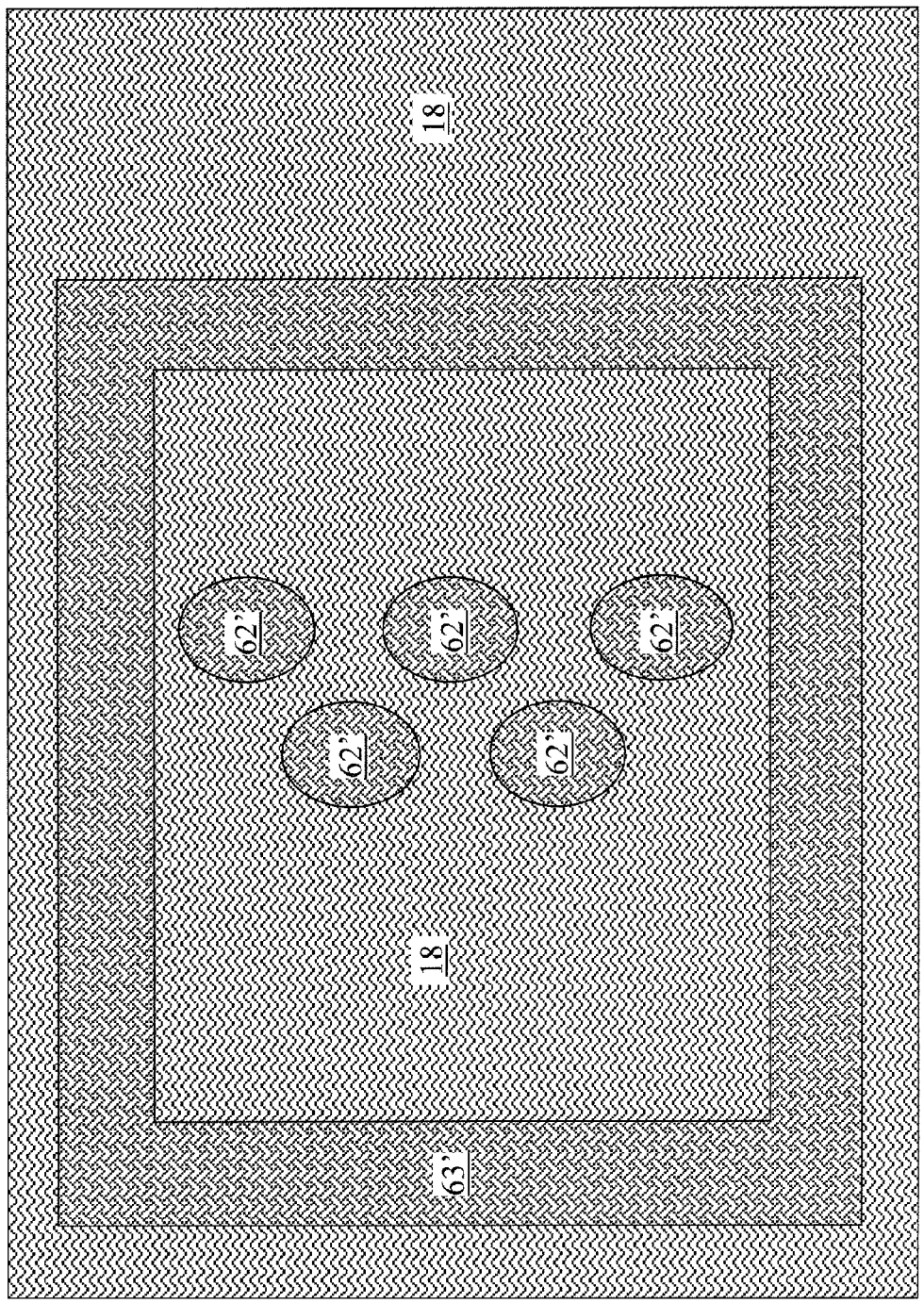
FIG. 7B is a top-down view of the first exemplary semiconductor structure of FIG. 7A according to the first embodiment of the present invention.

Referring to FIGS. 7A and 7B, the top portions of the node dielectrics 50, the inner electrodes (52, 60), the first isolation dielectric layer 51, and the at least one conductive material portion (53, 61) are vertically recessed in a recess etch employing the at least one pad layer 18 as an etch mask. The recess etch can be a dry etch, a wet etch, or a combination thereof. Typically, the recessed surfaces of the node dielectrics 50, the inner electrodes (52, 60), the first isolation dielectric layer 51, and the at least one conductive material portion (53, 61) are located between the top surface of the upper insulator layer 16 and the bottom surface of the upper insulator layer 16 at the end of the recess etch.

A conductive material is deposited to fill the recesses. The excess conductive material is removed above the top surface of the at least one pad layer 18 by planarization. Each remaining portion of the conductive material within the recessed region in a deep trench constitutes a prototype buried strap portion 62', and the remaining portion of the conductive material within the recessed region in the contiguous deep trench constitutes a prototype conductive plug 63'. The conductive material of the prototype buried strap portions 62' and the prototype conductive plug 63' can be a doped semiconductor material having a doping of a same conductivity type (i.e., p-type or n-type) as the inner electrode doped semiconductor portion 60 and the first moat doped semiconductor portion 61. In one embodiment, the prototype buried strap portions 62' and the prototype conductive plug 63' can include doped polysilicon.

Each capacitor region C includes a capacitor. The outer electrode of each capacitor includes a portion of the doped polycrystalline semiconductor layer 14 surrounding the sidewall of a deep trench. The node dielectric 50 located directly on the sidewalls and the bottom surface of the deep trench constitutes a capacitor dielectric. The inner electrode of the capacitor includes at least one fill material within the node dielectric 50, i.e., an inner electrode metallic layer 52 and an inner electrode doped semiconductor portion 60. A prototype buried strap portion 62' is located directly on an inner electrode (52, 60) and a node dielectric 50. Each prototype buried strap portion 62' contacts a top semiconductor portion 30'.

The moat region M includes a first moat isolation structure, which includes a contiguous deep trench and the structures therein. The first moat isolation structure includes the first isolation dielectric layer 51, the first moat metallic layer 53, the first moat doped semiconductor portion 61, and the prototype conductive plug 63'. The first isolation dielectric layer 51 electrically isolates the doped polycrystalline semiconductor layer 14 from the first moat metallic layer 53, the first moat doped semiconductor portion 61, and the prototype conductive plug 63'. The first moat isolation structure (51, 53, 61, 53') laterally surrounds a portion of the stack of the doped polycrystalline semiconductor layer 14, a portion of the upper insulator layer 16, a top semiconductor portion 30', and a portion of the at least one pad layer 18.

Figure 8:
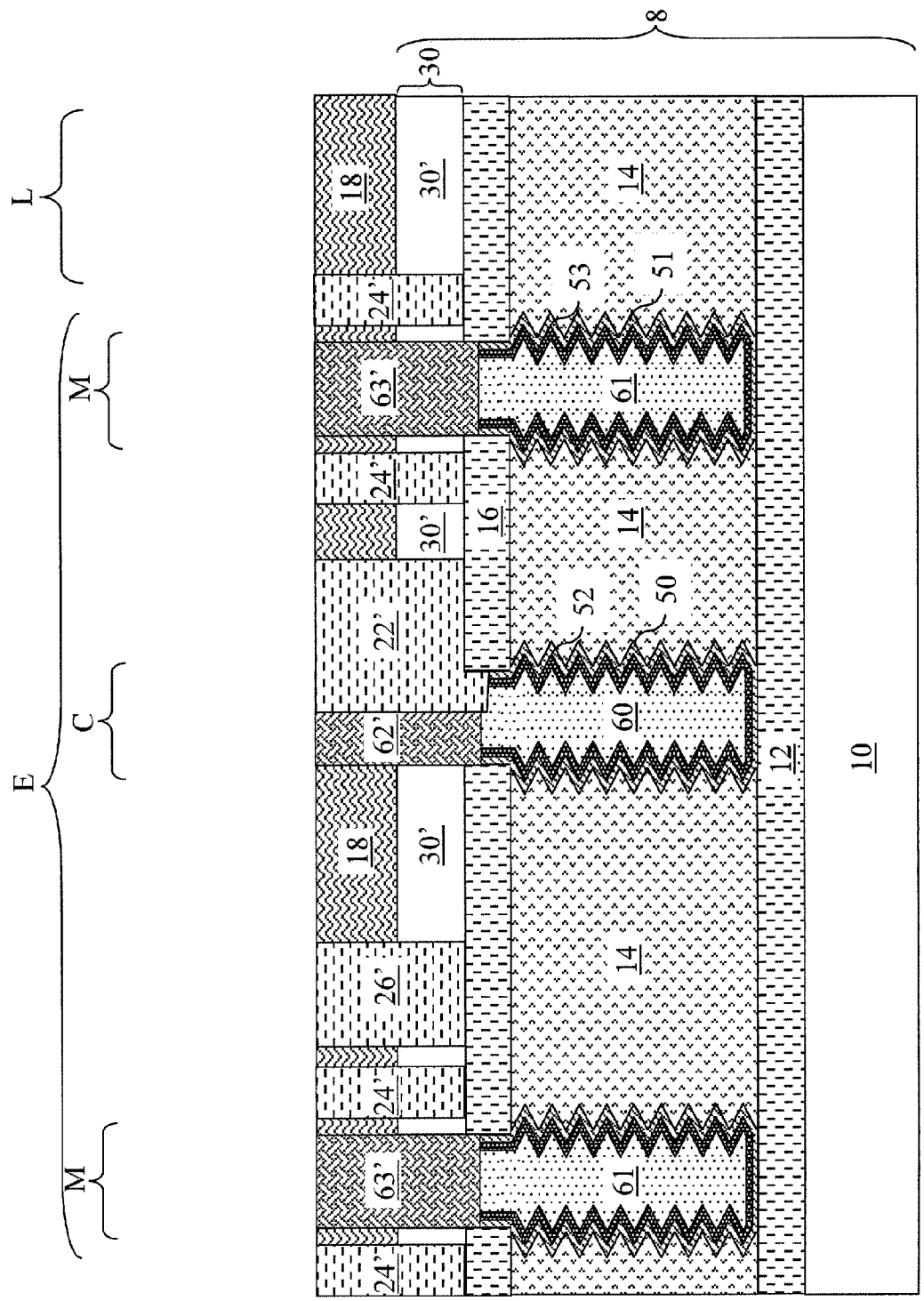
FIG. 8 is a vertical cross-sectional view of the first exemplary semiconductor structure after formation of prototype shallow trench isolation structures according to the first embodiment of the present invention.

Referring to FIG. 8, a photoresist (not shown) is applied over the top surfaces of the at least one pad layer 18, the prototype buried strap portions 62', and the prototype conductive plug 63' and is lithographically patterned to form openings therein. The pattern in the openings in the photoresist corresponds to shallow trench areas, i.e., areas from which portions of the top semiconductor layer 30 are subsequently removed to form shallow trenches therein. The pattern in the photoresist is transferred into the at least one pad layer 18 and the top semiconductor layer 30 by an anisotropic etch that employs the photoresist as an etch mask. The etch can be end-pointed to stop at the top surface of the upper insulator layer 16. Each region recessed by the etch constitutes a shallow trench. The photoresist is subsequently removed selective to the at least one pad layer 18, for example, by ashing.

A dielectric material such as silicon oxide is deposited within each shallow trench, and is subsequently planarized to form various prototype shallow trench isolation structures. The top surfaces of the various prototype shallow trench isolation structures are substantially coplanar with the top surface of the at least one pad layer 18 after the planarization process. The various prototype shallow trench isolation structures can include at least one first prototype shallow trench isolation structure 22' that subsequently provides electrical isolation among access transistors (to be subsequently formed in the eDRAM region E), at least one second prototype shallow trench isolation structure 24' that electrically isolates the prototype conductive plug 63' laterally, at least one third prototype shallow trench isolation structure 26' that provides electrical isolation for a first backside contact structure (to be subsequently formed through the at least one third prototype shallow trench isolation structure 26'), and at least one fourth prototype shallow trench isolation structure (not shown) that provides electrical isolation among devices to be formed in the logic region L.

Figure 9A:
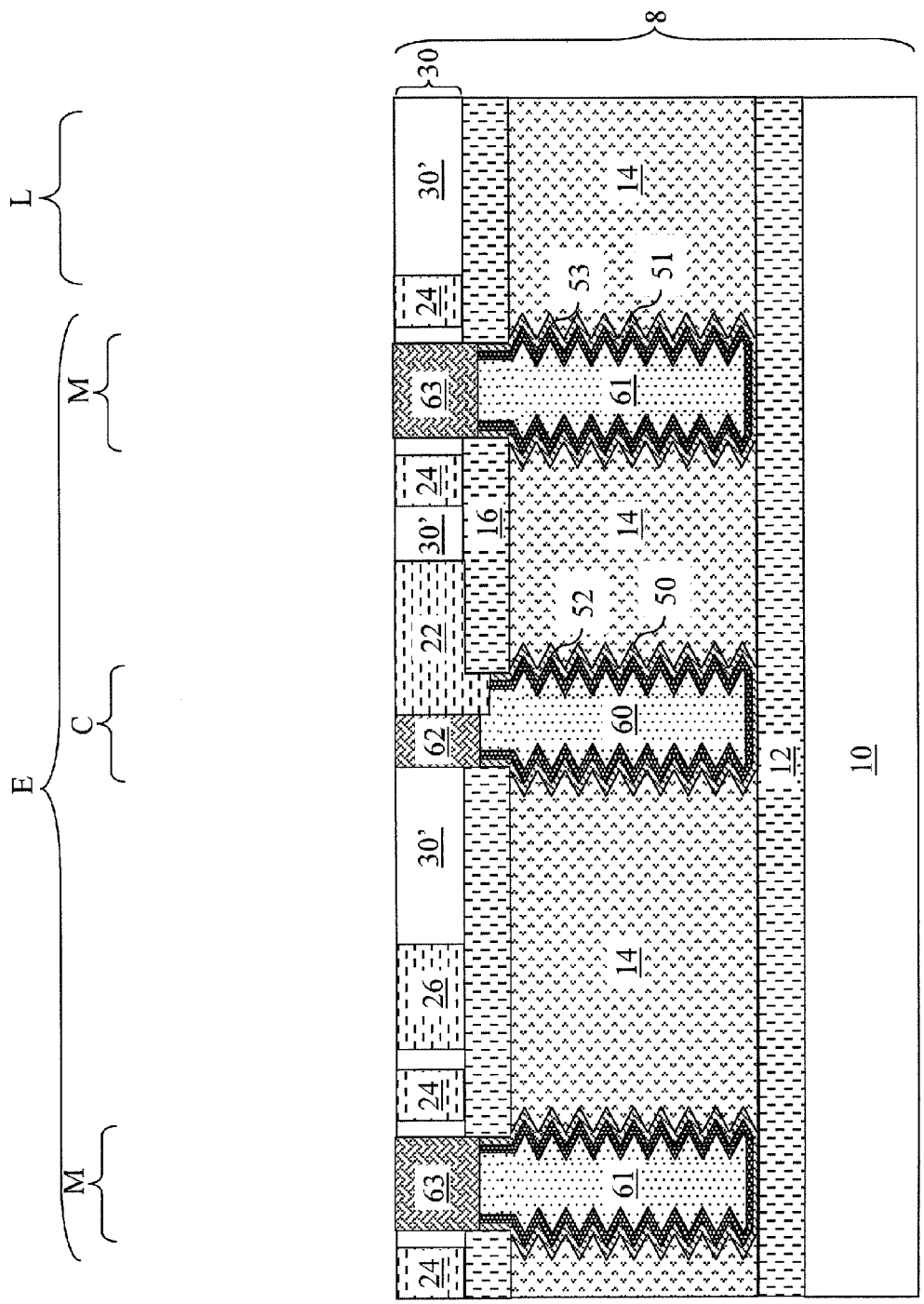
FIG. 9A is a vertical cross-sectional view of the first exemplary semiconductor structure after formation of buried strap portions and shallow trench isolation structures and removal of at least one pad layer according to the first embodiment of the present invention.
Figure 9B:
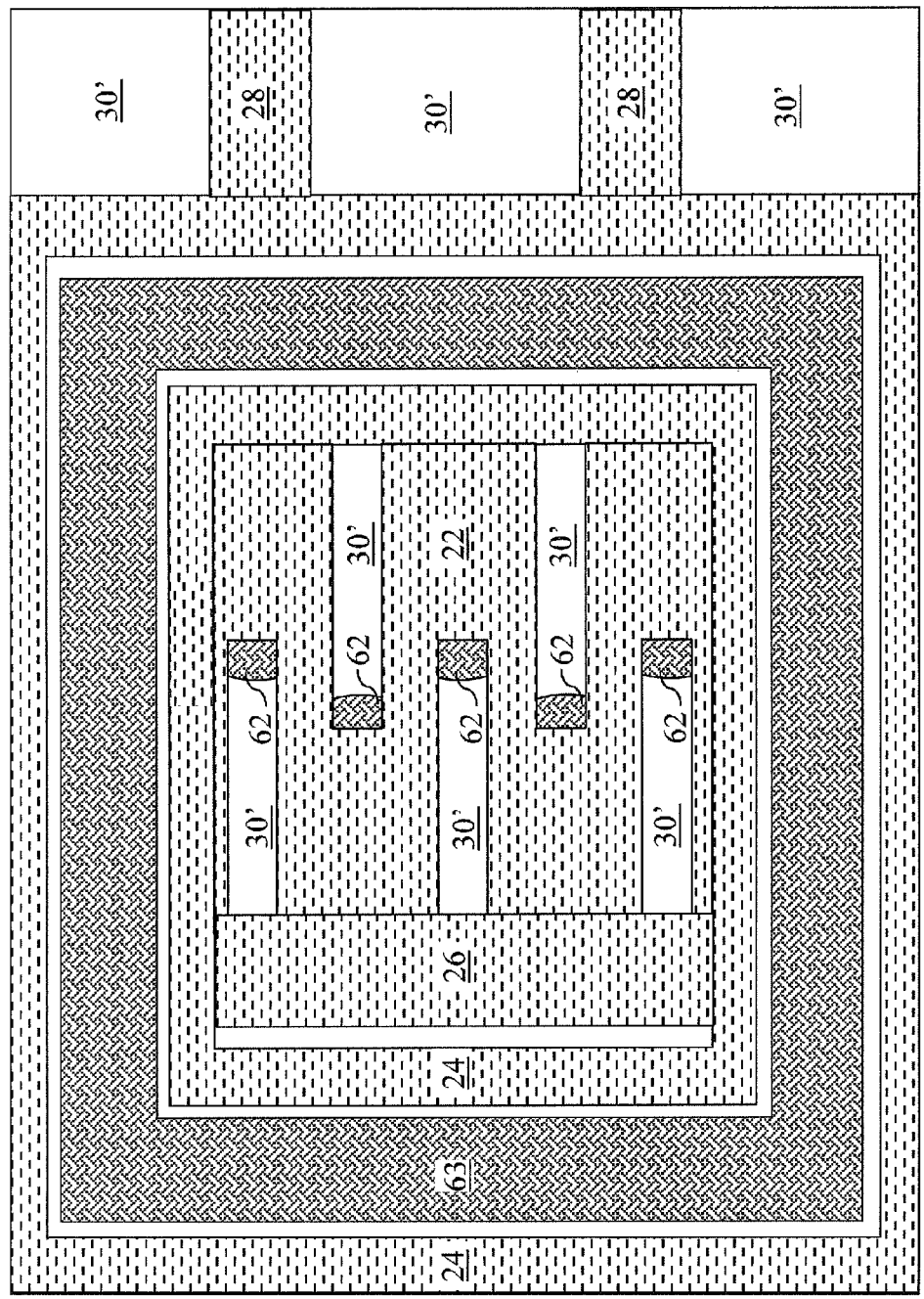
FIG. 9B is a top-down view of the first exemplary semiconductor structure of FIG. 9A according to the first embodiment of the present invention.

Referring to FIGS. 9A and 9B, the prototype buried strap portions 62' and the prototype conductive plug 63' are recessed relative to the top surface of the at least one pad layer 18 to a depth that is approximately equal to the top surface of the top semiconductor layer 30. The remaining portions of the prototype buried strap portions 62' and the prototype conductive plug 63' after recess are referred to as buried strap portions 62 and a first conductive plug 63, respectively. Further, the various prototype shallow trench isolation structures (22', 24', 26') are recessed relative to the top surface of the at least one pad layer 18 to a depth that is approximately equal to the top surface of the top semiconductor layer 30. The remaining portions of the at least one first prototype shallow trench isolation structure 22', at least one second prototype shallow trench isolation structure 24', at least one third prototype shallow trench isolation structure, and at least one fourth prototype shallow trench isolation structure are herein referred to as at least one first shallow trench isolation structure 22, at least one second shallow trench isolation structure 24, at least one third shallow trench isolation structure 26, and at least one fourth shallow trench isolation structure 28.

Subsequently, the at least one pad layer 18 is removed selective to the top semiconductor layer 30, which includes the top semiconductor portions 30', portions of the buried strap portions 62 and the first conductive plug 63, and the various shallow trench isolation structures (22, 24, 26, 28). While the present invention is described employing buried strap portions 62 and a first conductive plug 63 that have exposed surfaces at the top of the top semiconductor layer 30, embodiments in which additional processing steps are employed to eliminate or minimize the exposure of surfaces of the buried strap portions 62 and a first conductive plug 63 at the top surface of the top semiconductor layer 30 can also be employed. After removal of the at least one pad layer 18, the top surfaces of the top semiconductor portions 30', the buried strap portions 62, the first conductive plug 63, and the various shallow trench isolation structures (22, 24, 26, 28) can be substantially coplanar, i.e., located within the same plane such that the deviation of individual surfaces from the plane is limited by controllability of processing steps employed to form the various surfaces.

Figure 10:
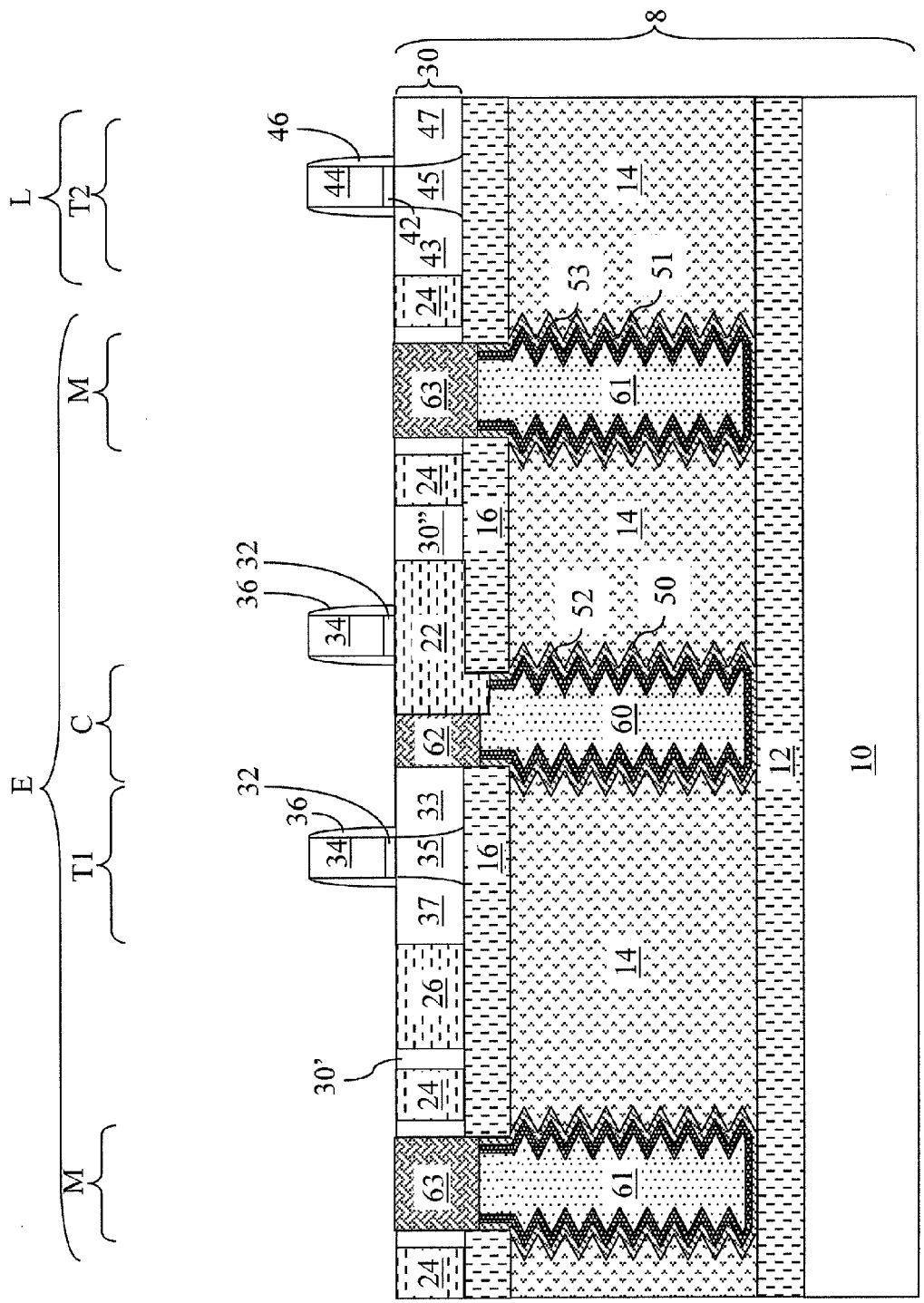
FIG. 10 is a vertical cross-sectional view of the first exemplary semiconductor structure after formation of access transistors and at least one logic device according to the first embodiment of the present invention.

Referring to FIG. 10, the top semiconductor portions 30' include various active regions, i.e., semiconductor regions on which semiconductor devices are formed. Transistors are subsequently formed on the various active regions. For example, the transistors can include at least one first transistor T1 located in the eDRAM region E and at least one second transistor T2 located in the logic region L. The at least one first transistor T1 can include an access transistor electrically connected to a capacitor in a capacitor region C. Typically, an access transistor is provided for each capacitor in the eDRAM region E.

For example, each first transistor T1 can include a first gate dielectric 32, a first gate conductor 34, a first gate spacer 36, a first source region 33, a first body region 35, and a first drain region 37. Each first source region 33 laterally contacts a buried strap portion 62. Typically, the inner electrode doped semiconductor portions 60, the buried strap portions 62, the first source regions 33, and the first drain regions 37 have a doping of the same conductivity type, which is herein referred to a first conductivity type, while the first body regions 35 have a doping of the opposite conductivity type, which is herein referred to as a second conductivity type. The various source and drain regions (33, 37, 43, 47) can be formed, for example, by masked ion implantation.

Each second transistor T2 can include a second gate dielectric 42, a second gate conductor 44, a second gate spacer 46, a second source region 43, a second body region 45, and a second drain region 47. Each second transistor T2 can be a p-type transistor or an n-type transistor. Additional devices such as bipolar devices and diodes can be formed in the logic region L and/or in the eDRAM region E.

Each access transistor is located in the top semiconductor layer 30. The access transistor has an electrically conductive path to the inner electrode (52, 60) of an adjacent capacitor, and controls current flow to the inner electrode (52, 60) of that capacitor. Each buried strap portion 62 contact a source region 33 of an access transistor and an inner electrode (52, 60), constituting a part of the electrically conductive path.

Figure 11A:
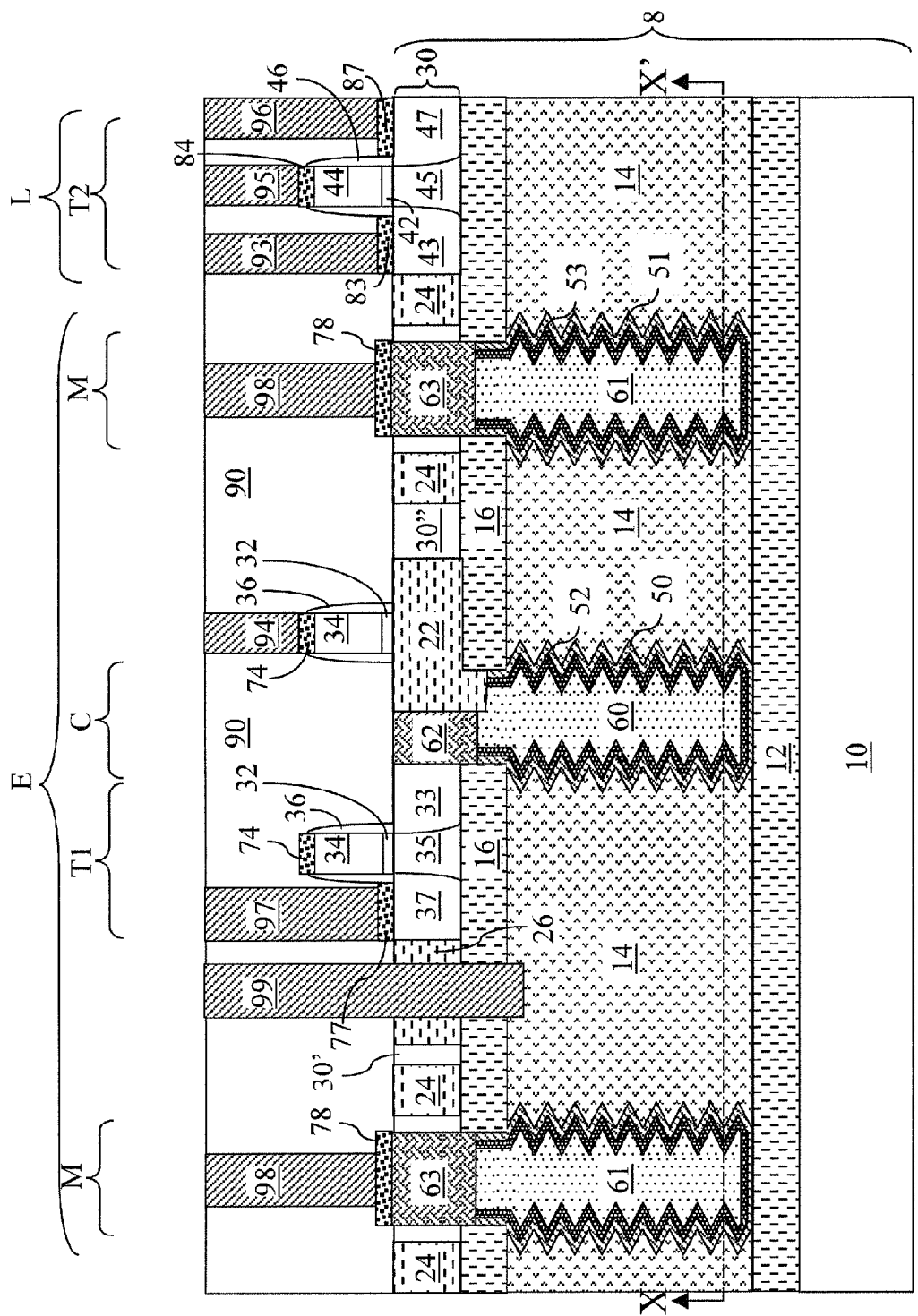
FIG. 11A is a vertical cross-sectional view of the first exemplary semiconductor structure after formation of a MOL dielectric layer and various contact structures according to the first embodiment of the present invention.
Figure 11B:
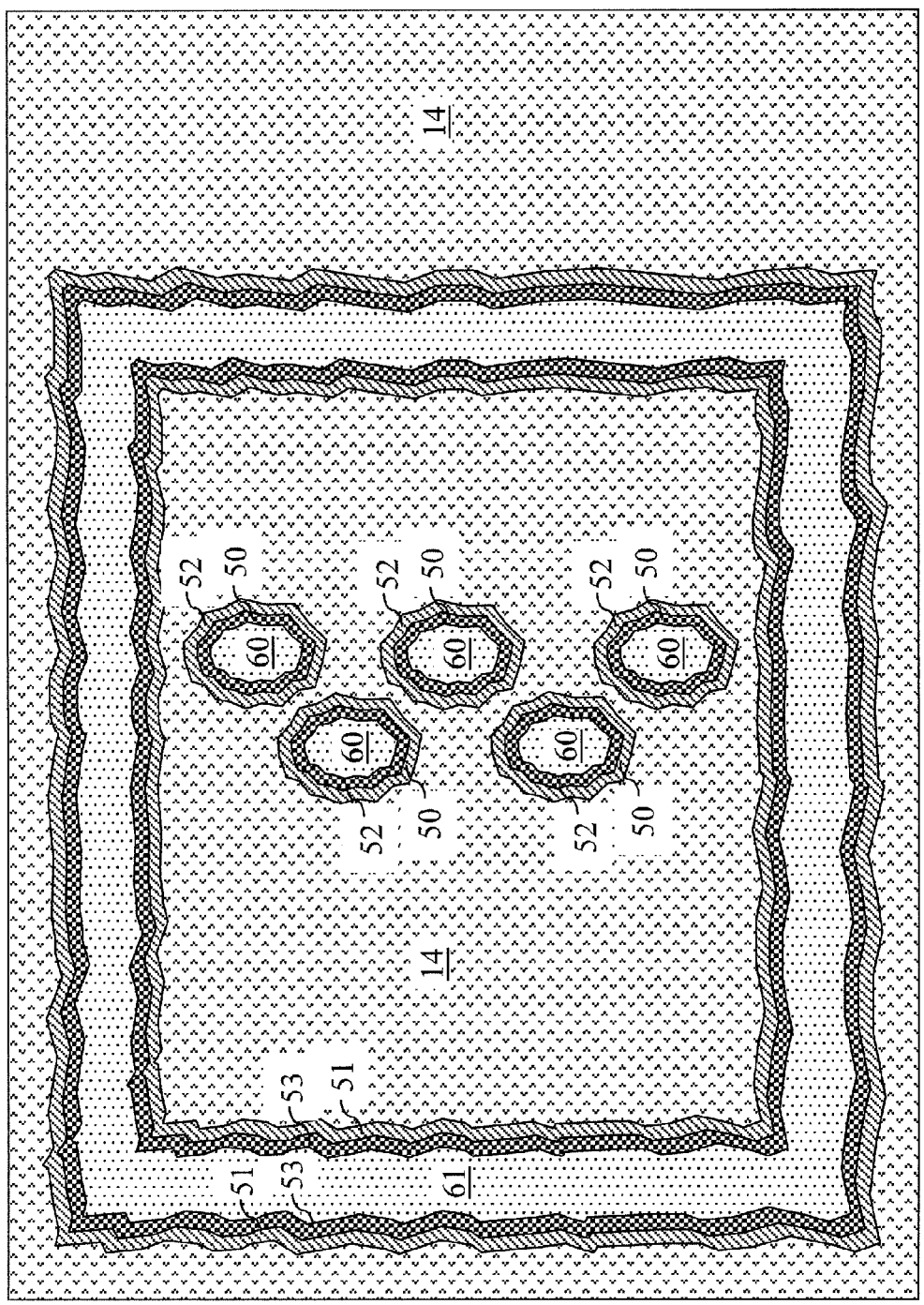
FIG. 11B is a horizontal cross-sectional view of the first exemplary semiconductor structure of FIG. 11A along a plane X-X' according to the first embodiment of the present invention.

Referring to FIGS. 11A and 11B, various metal semiconductor alloy portions are formed on selected semiconductor surfaces. Areas of semiconductor surface in which formation of a metal semiconductor alloy are not desired can be masked, for example, by a temporary masking layer comprising a dielectric material. The various metal semiconductor alloy portions can be formed by depositing a metal layer (not shown) and inducing a reaction between the metal layer and underlying semiconductor material portions.

For example, a first drain-side metal semiconductor alloy portion 77 can be formed on each first drain region 37, a first gate-side metal semiconductor alloy portion 74 can be formed on each first gate conductor 34, and a first moat-contact metal semiconductor alloy portion 78 can be formed on the top surface of the first conductive plug 63 in the moat region M. Further, a source-side metal semiconductor alloy portion 83 can be formed on each second source region 43, a second drain-side metal semiconductor alloy portion 87 can be formed on each second drain region 47, and a second gate-side metal semiconductor alloy portion 84 can be formed on each second gate conductor 44. Typically, formation of metal semiconductor alloy portions on the first source regions 33 and the buried strap portions 62 is avoided, although embodiments in which such metal semiconductor alloy portions are formed can also be employed.

A middle-of-line (MOL) dielectric layer 90 is deposited over the top semiconductor layer 30 and the various metal semiconductor alloy portions (77, 74, 78, 83, 87, 84). The MOL dielectric layer 90 can comprise, for example, a CVD oxide. The CVD oxide can be an undoped silicate glass (USG), borosilicate glass (BSG), phosphosilicate glass (PSG), fluorosilicate glass (FSG), borophosphosilicate glass (BPSG), or a combination thereof. The thickness of the MOL dielectric layer 82 can be from 200 nm to 500 nm. The MOL dielectric layer 90 is preferably planarized, for example, by chemical mechanical polishing (CMP).

Various contact via holes are formed in the MOL dielectric layer 90 and filled with metal to from various contact via structures. For example, bit line contact via structures 97 can be formed to contact each of the first drain-side metal semiconductor alloy portions 77. Word line contact via structures 94 can be formed to contact each of the first gate-side metal semiconductor alloy portions 74. A source-side contact via structure 93 can be formed to contact each of the source-side metal semiconductor alloy portions 83. A drain-side contact via structure 96 can be formed to contact each of the second drain-side metal semiconductor alloy portions 87. A gate-side contact via structure 94 can be formed to contact each of the second gate-side metal semiconductor alloy portions 84.

The first moat isolation structure includes a contiguous deep trench that laterally surrounds the deep trenches of the capacitors and source and drain regions of the access transistors. The first isolation dielectric layer 51 of the first moat isolation structure includes the same material as the node dielectrics 50. In general, the at least one conductive material of the first moat isolation structure has the same composition as the at least one fill material of each inner electrode (52, 60). The first moat isolation structure (51, 53, 61, 63) extends from the top surface of the top semiconductor layer 30 to the bottom surface of the doped polycrystalline semiconductor layer 14.

A moat contact via structures 98 can be formed on the first moat-contact metal semiconductor alloy portion 78 to provide electrical bias to the inside of the first moat isolation structure, i.e., to the a first moat metallic layer 53, the first moat doped semiconductor portion 61, and the first conductive plug 63. Further, a first backside contact structure 99 can be formed through the MOL dielectric layer 90, the at least one third shallow trench isolation structure 26, and the upper insulator layer 16 to provide electrical contact to a portion of the doped polycrystalline semiconductor layer 14 within the first moat isolation structure (51, 53, 61, 63). The first backside contact structure 99 is electrically isolated from the top semiconductor layer 30 by the at least one second shallow trench isolation structure 24.

The outer electrode of the capacitors, which is the portion of the doped polycrystalline semiconductor layer 14 within the first moat isolation structure (51, 53, 61, 63), can be electrically biased through the first backside contact structure 99. Further, the inside of the first backside contact structure 99 can be electrically biased through the moat contact via structures 98 to provide optimal performance of the eDRAM devices with the eDRAM region E.

Figure 12A:
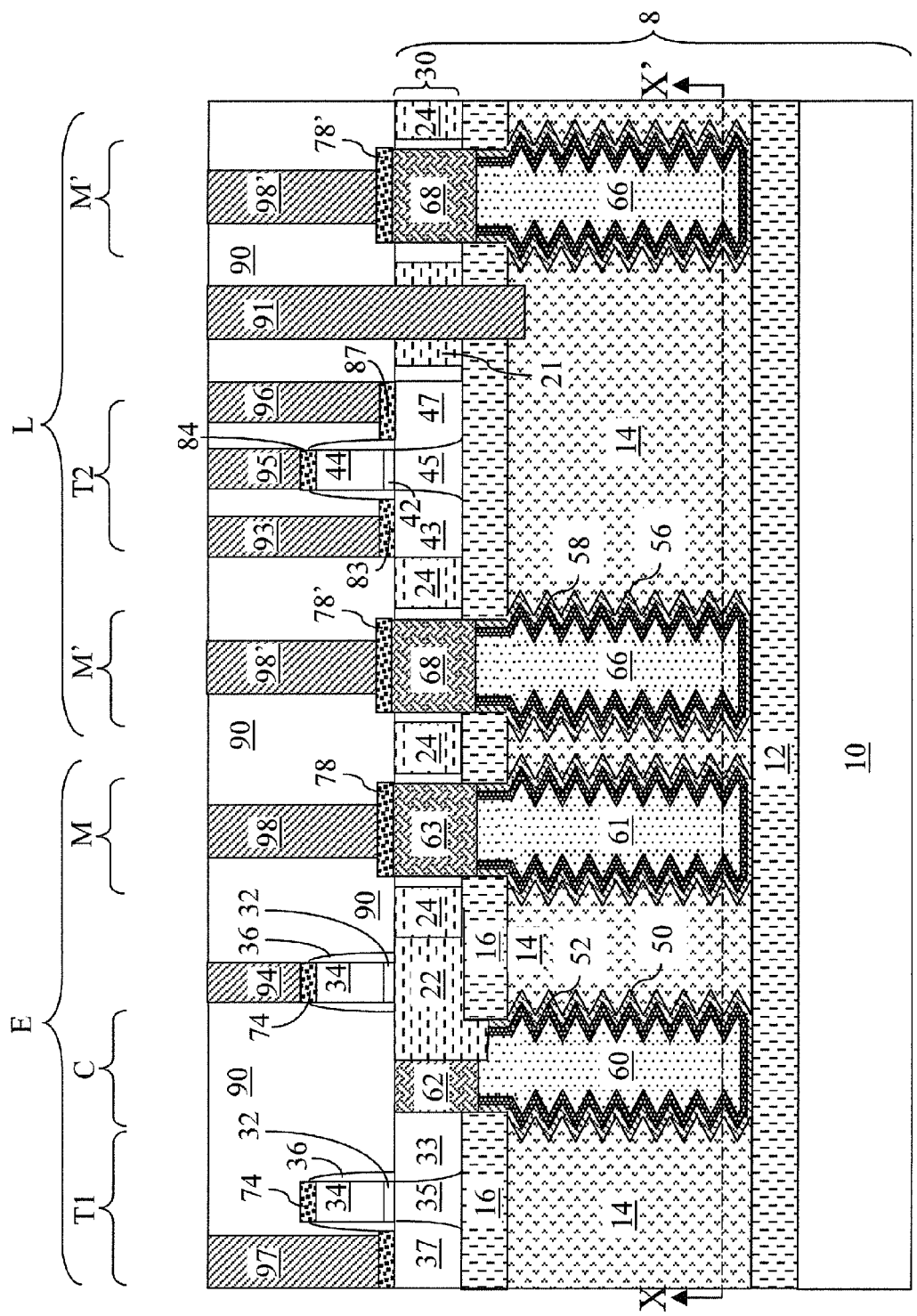
FIG. 12A is a vertical cross-sectional view of a second exemplary semiconductor structure after formation of a MOL dielectric layer and various contact structures according to a second embodiment of the present invention.
Figure 12B:
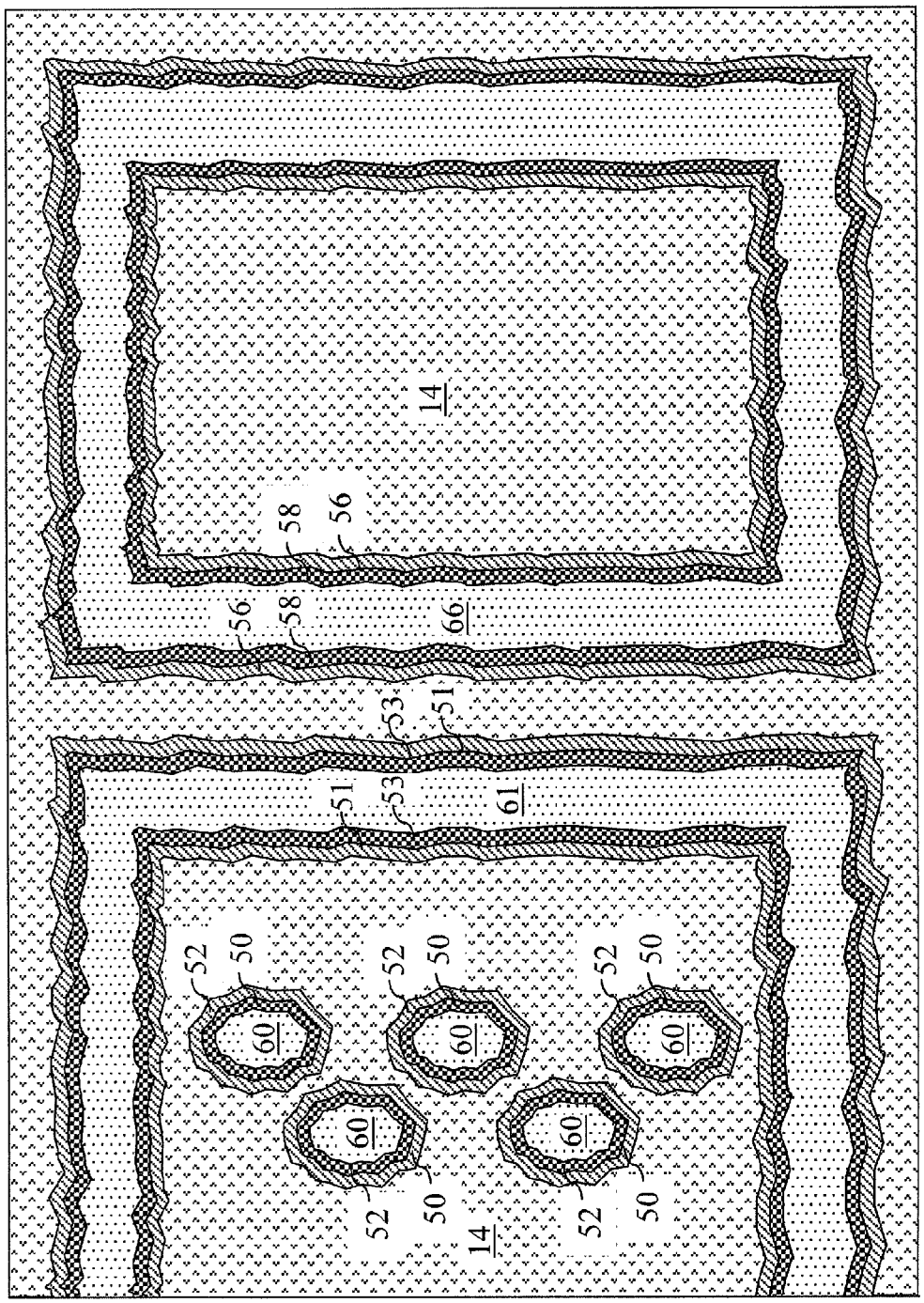
FIG. 12B is a horizontal cross-sectional view of the second exemplary semiconductor structure of FIG. 12A along a plane X-X' according to the second embodiment of the present invention.

Referring to FIGS. 12A and 12B, a second exemplary semiconductor structure according to a second embodiment of the present invention can be derived from the first exemplary semiconductor structure by forming a second moat isolation structure concurrently with the formation of the first moat isolation structure of the first embodiment. The second moat isolation structure is formed in the logic region L to laterally enclose portions of at least one semiconductor device in the top semiconductor layer 30 within the logic region L.

The second moat isolation structure includes a second isolation dielectric layer 56, which has the same composition and thickness as, and formed concurrently with, the first isolation dielectric layer 51 and the node dielectrics 50. The second moat isolation structure further includes the same at least one fill material as the inner electrodes (52, 60) and the at least one conductive material portion (53, 61). For example, the second moat isolation structure can further include a second moat metallic layer 58 and a second moat doped semiconductor portion 66, which have the same composition as the moat metallic layer 53 and the first moat doped semiconductor portion 61, respectively. In addition, the second moat isolation structure can include a second conductive plug 68, which has the same composition as the buried strap portions 62 and the first conductive plug 63. A second moat-contact metal semiconductor alloy portion 78' can be formed on the top surface of the second conductive plug 68.

Additional moat contact via structures 98' can be formed on the second moat-contact metal semiconductor alloy portion 78' to provide electrical bias to the inside of the second moat isolation structure, i.e., to the a second moat metallic layer 58, the second moat doped semiconductor portion 66, and the second conductive plug 68. Further, a second backside contact structure 91 can be formed through the MOL dielectric layer 90, at least one fifth shallow trench isolation structure 21 located within the logic region L, and the upper insulator layer 16 to provide electrical contact to a portion of the doped polycrystalline semiconductor layer 14 within the second moat isolation structure (56, 58, 66, 68). The second backside contact structure 91 is electrically isolated from the top semiconductor layer 30 by the at least one fifth shallow trench isolation structure 21.

The second moat isolation structure (56, 58, 66, 68) includes a contiguous deep trench that laterally surrounds a portion of the at least one semiconductor device in the top semiconductor layer 14 within the logic region L. The second moat isolation structure (56, 58, 66, 68) does not laterally surround the deep trenches or the access transistors in the eDRAM region E.

Figure 13:
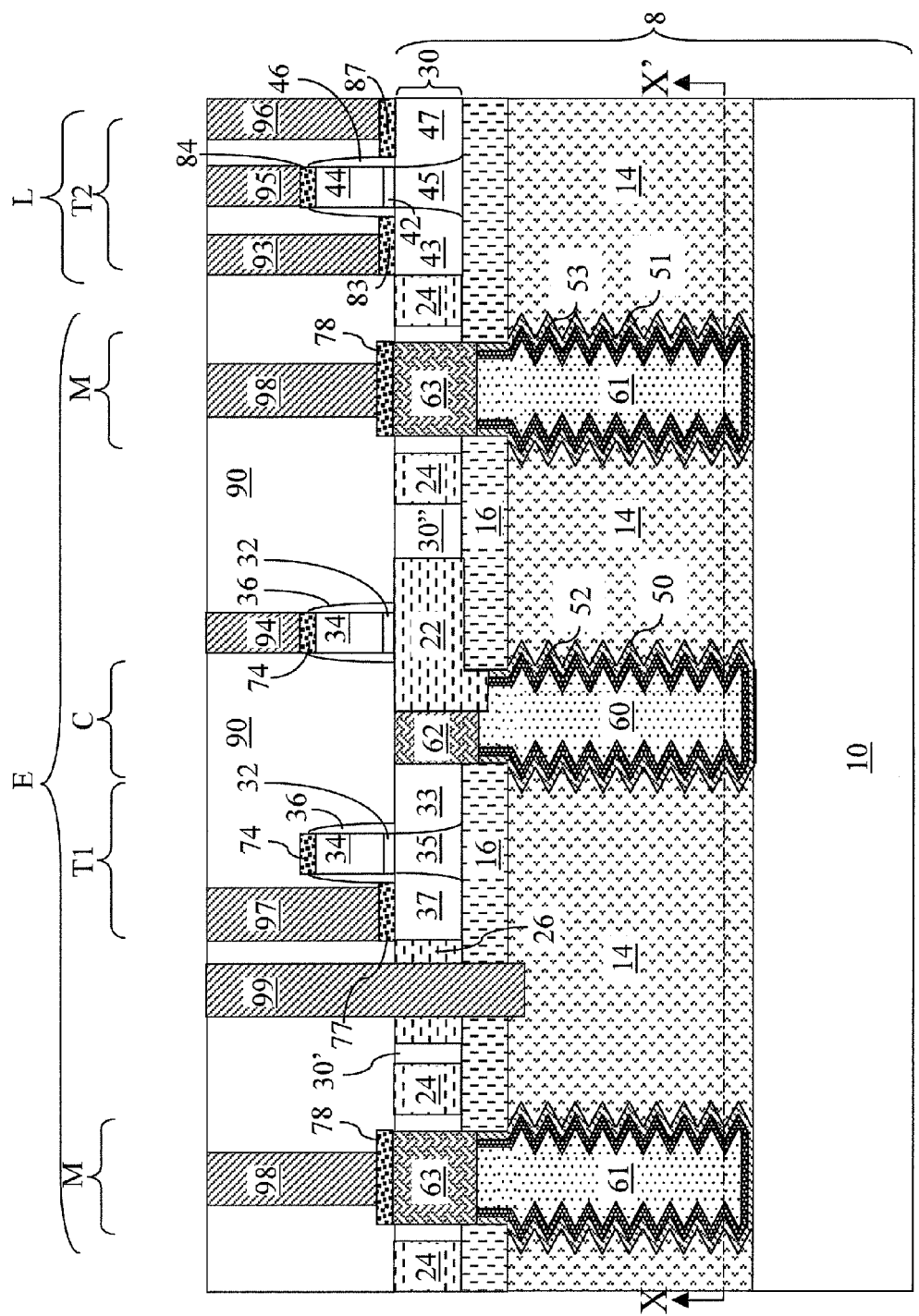
FIG. 13 is a vertical cross-sectional view of a third exemplary semiconductor structure according to a third embodiment of the present invention.

Referring to FIG. 13, a third exemplary semiconductor structure according to a third embodiment of the present invention can be derived from the first exemplary semiconductor structure or the second exemplary semiconductor structure by removing the optional lower insulator layer 12 and employing a dielectric substrate for the handle substrate 10. In other words, the handle substrate 10 of the third exemplary semiconductor structure includes an insulating material, and the bottom surface of the doped polycrystalline layer 14 contacts a top surface of the handle substrate 10.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a semiconductor substrate comprising at least a handle substrate, a doped polycrystalline semiconductor layer located above said handle substrate, an upper insulator layer contacting a top surface of said doped polycrystalline semiconductor layer, and a top semiconductor layer contacting a top surface of said upper insulator layer;
   a deep trench extending from a top surface of said top semiconductor layer to a bottom surface of said doped polycrystalline semiconductor layer;
   a capacitor comprising an outer electrode comprising a portion of said doped polycrystalline semiconductor layer, a node dielectric located in said deep trench, and an inner electrode comprising at least one fill material within said node dielectric; and an access transistor located in said top semiconductor layer and controlling current flow to said inner electrode.

2. The semiconductor structure of claim 1, further comprising a lower insulator layer contacting a top surface of said handle substrate and said bottom surface of said doped polycrystalline layer.

3. The semiconductor structure of claim 1, wherein said handle substrate comprises an insulating material, and said bottom surface of said doped polycrystalline layer contacts a top surface of said handle substrate.

4. The semiconductor structure of claim 1, wherein surfaces of said deep trench within said doped polycrystalline semiconductor layer include crystallographic facets of grains of a doped polycrystalline semiconductor material, wherein some of said crystallographic facets are not vertical.

5. The semiconductor structure of claim 4, wherein an entirety of surfaces of said deep trench between said top surface of said doped polycrystalline semiconductor layer and a bottom surface of said doped polycrystalline semiconductor layer consists essentially of said crystallographic facets of grains of said doped polycrystalline semiconductor material.

6. The semiconductor structure of claim 4, wherein a horizontal cross-sectional area of said deep trench is an irregular polygon, wherein each side of said irregular polygon corresponds to a facet of said crystallographic facets of grains of said doped polycrystalline semiconductor material.

7. The semiconductor structure of claim 4, wherein said doped polycrystalline semiconductor material is selected from doped polysilicon, doped polycrystalline germanium, a doped silicon-germanium polycrystalline alloy, a doped silicon carbon polycrystalline alloy, a doped silicon-germanium-carbon polycrystalline alloy, doped polycrystalline gallium arsenide, doped polycrystalline indium arsenide, doped polycrystalline indium phosphide, doped polycrystalline III-V compound semiconductor materials, doped polycrystalline II-VI compound semiconductor materials, doped polycrystalline organic semiconductor materials, and other doped polycrystalline compound semiconductor materials.

8. The semiconductor structure of claim 4, wherein a predominant portion of said crystallographic facets of grains of said doped polycrystalline semiconductor material has a set of Miller indices representing an equivalent crystallographic orientation.

9. The semiconductor structure of claim 1, wherein said node dielectric comprises a dielectric metal oxide having a dielectric constant greater than 8.0.

10. The semiconductor structure of claim 1, wherein said at least one fill material comprises a metal layer contacting said node dielectric and a doped semiconductor material portion contacting inner sidewalls of said metal layer.

11. The semiconductor structure of claim 1, further comprising a buried strap portion comprising a doped semiconductor material, located in an upper portion of said deep trench, and contacting a source region of said access transistor.

12. The semiconductor structure of claim 1, further comprising a moat isolation structure comprising a contiguous deep trench that laterally surrounds said deep trench and source and drain regions of said access transistor, wherein said contiguous deep trench is filled with an isolation dielectric layer comprising a same material as said node dielectric and at least one conductive material having a same composition as said at least one fill material.

13. The semiconductor structure of claim 12, wherein said moat isolation structure extends from said top surface of said top semiconductor layer to said bottom surface of said doped polycrystalline semiconductor layer.

14. The semiconductor structure of claim 12, further comprising a backside contact structure extending through said top semiconductor layer and said upper buried insulator layer, contacting a portion of said doped polycrystalline semiconductor layer within said moat isolation structure, and electrically isolated from said top semiconductor layer.

15. The semiconductor structure of claim 1, further comprising:

at least one semiconductor device located on said top semiconductor layer; and an moat isolation structure comprising a contiguous deep trench that laterally surrounds a portion of said at least one semiconductor device in said top semiconductor layer and not laterally surrounding said deep trench or said access transistor, wherein said contiguous deep trench is filled with an isolation dielectric layer comprising a same material as said node dielectric and at least one conductive material having a same composition as said at least one fill material.

16. The semiconductor structure of claim 15, further comprising a backside contact structure extending through said top semiconductor layer and said upper buried insulator layer, contacting a portion of said doped polycrystalline semiconductor layer within said an moat isolation structure, and electrically isolated from said top semiconductor layer.

17. A method of forming a semiconductor structure comprising:

forming a semiconductor substrate comprising at least a handle substrate, a doped polycrystalline semiconductor layer located above said handle substrate, an upper insulator layer contacting a top surface of said doped polycrystalline semiconductor layer, and a top semiconductor layer contacting a top surface of said upper insulator layer;

forming a deep trench extending from a top surface of said top semiconductor layer to a bottom surface of said doped polycrystalline semiconductor layer;

forming a node dielectric on sidewalls of said deep trench;

forming an inner electrode by depositing at least one fill material on said node dielectric within said deep trench; and forming an access transistor having an electrically conductive path to said inner electrode in said top semiconductor layer.

18. The method of claim 17, wherein said semiconductor substrate further comprises a lower insulator layer contacting a top surface of said handle substrate and said bottom surface of said doped polycrystalline layer, wherein a top surface of said lower insulator layer is exposed during formation of said deep trench.

19. The method of claim 17, wherein said handle substrate comprises an insulating material, and a top surface of said handle substrate is exposed during formation of said deep trench.

20. The method of claim 17, wherein said deep trench is formed by:

anisotropically etching a portion of said doped polycrystalline semiconductor layer, wherein sidewalls of said deep trench extends from said top surface of said top semiconductor layer to said bottom surface of said doped polycrystalline semiconductor layer; and forming crystallographic facets of grains of a doped polycrystalline semiconductor material of said doped polycrystalline semiconductor layer on said sidewalls by crystallographic etching that provides different etch rates for different crystallographic facets.

21. The method of claim 20, wherein a predominant portion of said crystallographic facets of grains of said doped polycrystalline semiconductor material has a set of Miller indices representing an equivalent crystallographic orientation.

22. The method of claim 17, further comprising forming a buried strap portion comprising a doped semiconductor material in an upper portion of said deep trench, wherein said buried strap portion contact a source region of said access transistor and said inner electrode.

23. The method of claim 17, further comprising forming a moat isolation structure comprising a contiguous deep trench that laterally surrounds said deep trench and source and drain regions of said access transistor, wherein said contiguous deep trench is filled with an isolation dielectric layer comprising a same material as said node dielectric and at least one conductive material having a same composition as said at least one fill material.

24. The method of claim 17, further comprising forming a backside contact structure through said top semiconductor layer and said upper buried insulator layer, wherein said backside contact structure contacts a portion of said doped polycrystalline semiconductor layer within said moat isolation structure, and is electrically isolated from said top semiconductor layer.

25. The method of claim 17, further comprising:
forming at least one semiconductor device on said top semiconductor layer; and
forming an moat isolation structure comprising a contiguous deep trench that laterally surrounds a portion of said at least one semiconductor device in said top semiconductor layer and not laterally surrounding said deep trench or said access transistor, wherein said contiguous deep trench is filled with an isolation dielectric layer comprising a same material as said node dielectric and at least one conductive material having a same composition as said at least one fill material.

* * * * *